(12) United States Patent
Bolis et al.

(10) Patent No.: US 8,363,330 B2
(45) Date of Patent: Jan. 29, 2013

(54) MEMBRANE, ESPECIALLY FOR AN OPTICAL DEVICE HAVING A DEFORMABLE MEMBRANE

(75) Inventors: Sébastien Bolis, Crolles (FR); Jean-Charles Barbe, Izeron (FR); Pierre-Louis Charvet, Saint Marin le Vinoux (FR)

(73) Assignee: Commissariat a l'Energie Atomique, Paris (FR)

( * ) Notice: Subject to any disclaimer, the term of this patent is extended or adjusted under 35 U.S.C. 154(b) by 273 days.

(21) Appl. No.: 12/937,977

(22) PCT Filed: Apr. 17, 2009

(86) PCT No.: PCT/EP2009/054621
§ 371 (c)(1), (2), (4) Date: Oct. 21, 2010

(87) PCT Pub. No.: WO2009/130171
PCT Pub. Date: Oct. 29, 2009

(65) Prior Publication Data
US 2011/0032624 A1    Feb. 10, 2011

(30) Foreign Application Priority Data
Apr. 21, 2008   (FR) ...................... 08 52668

(51) Int. Cl.
*G02B 1/06* (2006.01)
(52) U.S. Cl. .................................... 359/666
(58) Field of Classification Search .............. 359/665, 359/666
See application file for complete search history.

(56) References Cited

U.S. PATENT DOCUMENTS

| 5,138,484 | A | 8/1992 | Kurtin |
| 5,917,657 | A | 6/1999 | Kaneko |
| 6,344,930 | B1 | 2/2002 | Kaneko |
| 7,369,723 | B1 * | 5/2008 | Mescher ........................ 385/33 |

(Continued)

FOREIGN PATENT DOCUMENTS

| JP | 60220301 A | 11/1985 |
| JP | 8114703 A | 5/1996 |

(Continued)

OTHER PUBLICATIONS

Jung, Il Woong et al., "Single-Crystal-Silicon continuous Membrane Deformable Mirror Array for Adaptive Optics in Space-Based Telescopes", IEEE Journal of Selected Topics in Quantum Electronics, vol. 13, No, 2, pp. 162-167 (Mar./Apr. 2007).

(Continued)

*Primary Examiner* — Joseph P Martinez
(74) *Attorney, Agent, or Firm* — Nixon Peabody LLP

(57) ABSTRACT

An optical device having a deformable membrane comprising a flexible film having at least one peripheral anchoring zone, a central zone and an intermediate zone between the central zone and the anchoring zone. The membrane also includes one or more movable parts of electrostatic actuating means, each movable part being formed from a leg terminating on one side in a foot mechanically fastened to a film-fastening region located in the intermediate zone and terminating on the other side in a free end. The legs incorporate a movable electrode, the free end having to be attracted by a fixed electrode of the actuating means. The free end is placed facing the free end so as to deform at least the central zone of the membrane.

35 Claims, 22 Drawing Sheets

U.S. PATENT DOCUMENTS

2005/0041301 A1    2/2005  Kibayashi
2008/0180890 A1    7/2008  Bolis

FOREIGN PATENT DOCUMENTS

| | | | |
|---|---|---|---|
| JP | 10144975 | A | 5/1998 |
| JP | 20002243918 | A | 8/2002 |
| JP | 2002357774 | A | 12/2002 |
| JP | 2003170582 | A | 6/2003 |
| JP | 2004205975 | A | 7/2004 |
| JP | 2008058841 | A | 3/2008 |
| WO | 03102636 | A1 | 12/2003 |
| WO | 2004019362 | A1 | 3/2004 |

OTHER PUBLICATIONS

Quevy, Emmanuel et al., "Realization and Actuation of Continuous-Membrane by an Array of 3D Self-Assembling Micro-Mirrors for Adaptive Optics", Proceedings of the IEEE 14th Annual International Confeence on Micro-Electro Mechanical Systems, MEMS 2001, pp. 329-332 (Jan. 21-25, 2001).

International Search Report, PCT/EP2009/054621, dated Jul. 22, 2009.

French Preliminary Search Report, FR 0852668, dated Dec. 5, 2008.

International Preliminary Report on Patentability in International Application No. PCT/EP2009/054621, dated Jan. 20, 2011. (English Translation).

\* cited by examiner

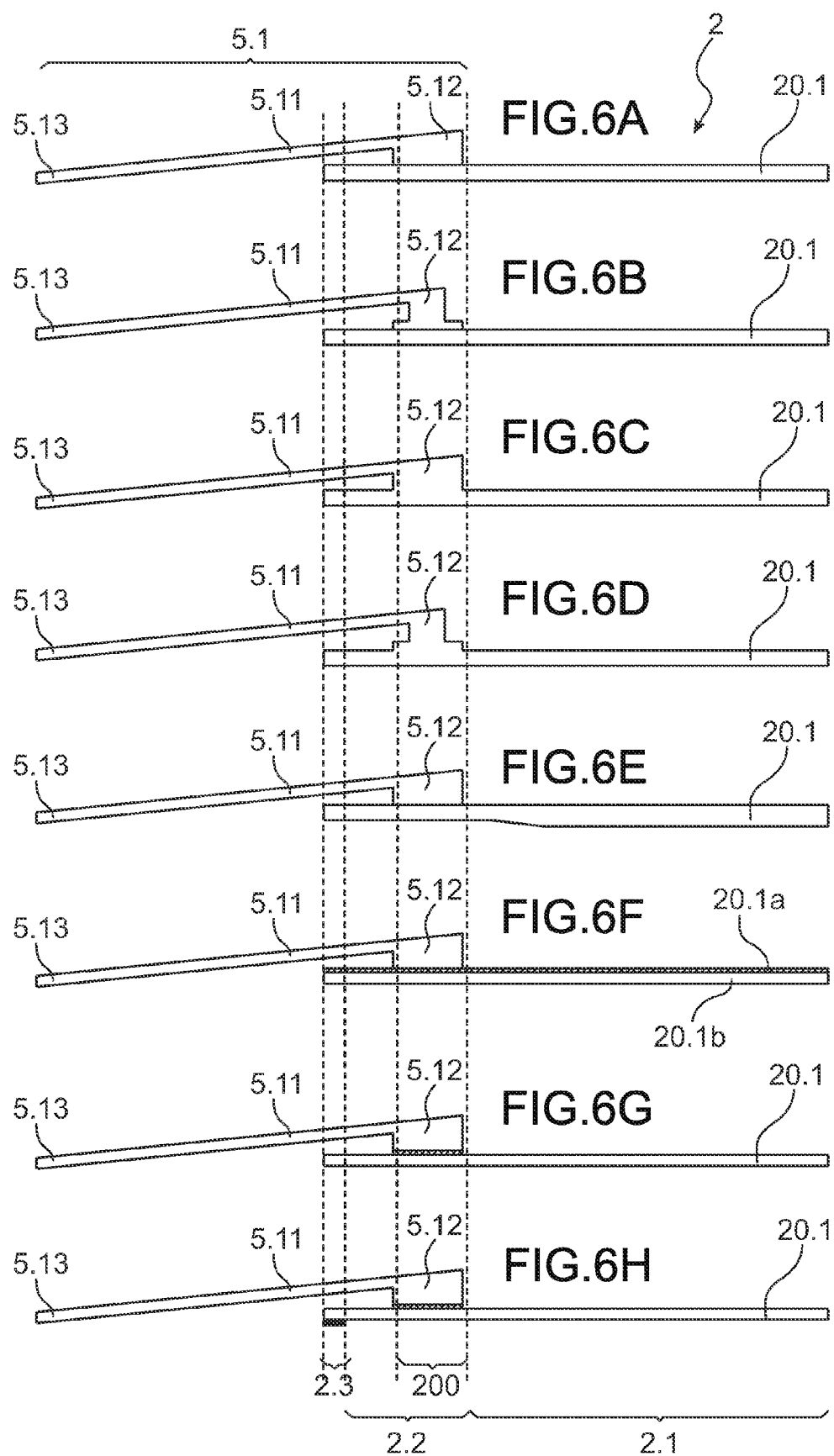

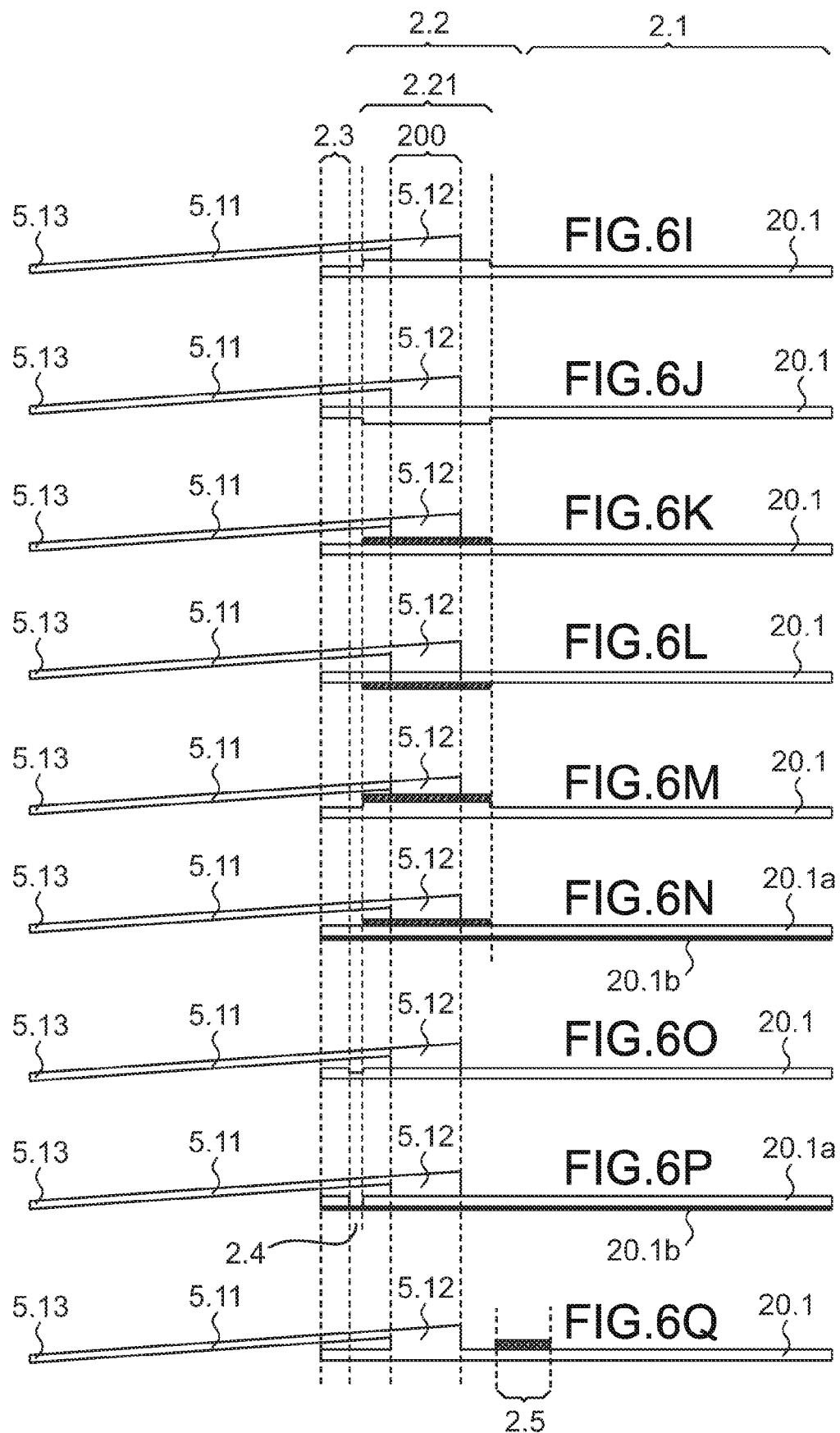

MEMBRANE, ESPECIALLY FOR AN OPTICAL DEVICE HAVING A DEFORMABLE MEMBRANE

CROSS REFERENCE TO RELATED APPLICATIONS OR PRIORITY CLAIM

This application is a national phase of International Application No. PCT/EP2009/054621, entitled "IMPROVED MEMBRANE, ESPECIALLY FOR AN OPTICAL DEVICE HAVING A DEFORMABLE MEMBRANE", which was filed on Apr. 17, 2009, and which claims priority of French Patent Application No. 08 52668, filed Apr. 21, 2008.

TECHNICAL FIELD

The present invention relates to an optical device with deformable membrane such as a liquid lens with variable focal distance, a liquid lens with optical aberration correction in adaptive optics or instead a mirror with deformable membrane.

Among all the types of variable focal distance liquid lenses, there exists a shape of an optical liquid working at constant volume between walls, among which at least one may be displaced. Optical liquid is taken to mean a liquid that has optical properties appropriate to the refraction of light and which has an index greater than 1, typically 1.4 or 1.5. The term liquid will simply be employed hereafter. However, lenses of this type are little used in miniature cameras such as those incorporated in telephone-cameras because the mechanical structures for varying their focal distance are complex, they penalize the size, the cost and the reliability of such lenses.

These miniature cameras, operating in the visible, are known by the acronym CCM for "compact camera module". The latter are rather provided with lenses constituted of one or two liquids to which is applied a voltage in order to modify their wettability.

Nevertheless, numerous developments are underway, including in particular the autofocus function and the zoom function. It is aimed during the introduction of these functions to obtain as short a response time as possible. More generally, it is aimed to incorporate as many constituents as possible of these miniature cameras to reduce the costs, the size and the consumption of energy.

Another application concerns cameras operating in the infrared (IR). The progress in terms of integration is less, in most cases the optics are dissociated from the cameras. Several developments are underway, including in particular the incorporation of optics (creation of a camera module), the incorporation of the autofocus function, etc., but for the moment the associated technical solutions are not known and need to be defined.

In a deformable mirror application, said mirror is reflecting. It may be desired to adjust the focal distance of the mirror and thus its radius of curvature. Such a mirror may be used in ophthalmology or in adaptive optics.

STATE OF THE PRIOR ART

Variable focal distance optical devices such as variable focal distance liquid lenses constituted of a liquid working at constant volume between two walls, at least one of which is movable, have been the object of several patents, for example: U.S. Pat. No. 5,917,657, U.S. Pat. No. 6,344,930, JP-A-10-144975, JP-A-08-114 703, U.S. Pat. No. 5,138,494, WO 2003/102636, JP2002-243918 and JP-A-60 220301.

None of these patents mentions an application for a mobile telephone camera, but rather for glasses, optical microscopes and digital cameras for example. Indeed, the mechanical structures associated with the membranes are all very complex and have a far too high cost for this kind of application.

FIGS. 15A, 15B show two examples of variable focal distance liquid lenses, described in the U.S. Pat. No. 5,917,657. These lenses are chosen because they illustrate the least complex lenses.

The liquid lens 1000 of FIG. 15A is constituted of a first central transparent elastic film 106a, a second central transparent elastic film 106b, a peripheral elastic film 104 and a peripheral container 105. The first and second transparent elastic films 106a, 106b are placed opposite each other. The peripheral elastic film 104 is fixed around the first transparent elastic film 106a and the assembly forms a first deformable membrane. The first membrane is anchored on one face of the peripheral container 105. The second membrane is constituted of the second elastic film. It is anchored on another face of the peripheral container. All of these components are hermetically sealed to each other and contain a liquid 103. The electrostatic actuating means of the lens 102, the function of which is to exert a pressure on the liquid 103, act at the level of the peripheral elastic film 104. They are formed of several actuators 201 arranged in a crown shaped container 203. This container is relatively thick. Their action takes place on the membrane via a ring transferred onto the peripheral elastic film 104. The two containers 105, 203 are assembled face to face. The transparent elastic films only have an optical role and the peripheral elastic film only has a mechanical role.

These liquid lenses 1000 have drawbacks that are going to be listed.

An important drawback is linked to the type of actuation, which is bulky and complex, particularly due to the container.

The methods for producing these lenses are unitary and multidisciplinary. These methods include techniques stemming from plastics processing for elaborating and shaping films, injection and machining techniques for forming containers. The methods for hermetically assembling the films to the container are different depending on the nature of the sealing (plastic-plastic, plastic-glass, plastic-metal). In addition, the sealings to be made are not all situated in a same plane, which leads to delicate manipulations of films or wafers, which considerably complicates the method employed and the necessary tooling. These techniques are not compatible with the conventional batch production methods employed for the formation of micro-electro-mechanical systems MEMS or micro-opto-electro-mechanical systems MOEMS. Consequently, their cost remains high as does their size.

In addition, it is difficult to position during assembly the transparent elastic film to the peripheral elastic film and to position perfectly the ring during its transfer onto the peripheral elastic film 20. Another difficulty is to position perfectly the actuators in relation to the ring. If the positioning is not perfect, optical aberrations ensue which degrade the quality of the image obtained.

Furthermore, it is necessary that the peripheral elastic film that is going to be displaced by the electrostatic actuating means not just at rest but also in operation is as parallel as possible in relation to the surface of the peripheral container at the level of the anchoring. If not, optical aberrations occur and they degrade the quality of the image obtained. Indeed, in FIG. 15B is represented in section the liquid lens described in the U.S. Pat. No. 5,917,657, with the exception of the electrostatic actuating means. To avoid any risk of optical aberration, the principal planes in which extend the portions of membrane at the level of the sealing to the container and the sealing between the different films constituting the membrane must be substantially parallel. It is very difficult to achieve these results with the recommended multiple sealings.

Furthermore, since several films are hermetically sealed together, in the manner of a patchwork, and to the container to encapsulate the liquid, the risk of leakage is not negligible.

DESCRIPTION OF THE INVENTION

The present invention has precisely the aim of providing an optical device with deformable membrane such as a liquid lens or a mirror that does not have the above mentioned drawbacks, namely the complexity of the actuating means and their size, optical aberrations, the high risk of leakage, the incompatibility with the micro-electronic environment, the impossibility of a collective manufacture according to the standards used in microelectronics.

To achieve this aim, the present invention proposes an optical device comprising a membrane deformable in a reversible manner comprising a flexible film having at least one peripheral anchoring zone, a central zone, an intermediate zone between the central zone and the peripheral anchoring zone. The membrane is anchored at the level of its anchoring zone on a support. It comprises in addition electrostatic actuating means with one or more fixed electrodes borne by the support and one or more movable parts. The support and the membrane contribute to trapping a constant volume of liquid in contact with one of the faces of the film. The movable parts of the electrostatic actuating means are each formed of a leg terminating on one side in a foot mechanically fastened to a film-fastening region, this fastening region being situated in the intermediate zone, and on the other side in a free end. The leg incorporates a movable electrode at least on the side of its free end. The actuation of the electrostatic actuating means from a rest position to a working position has the effect of attracting the movable electrode towards the fixed electrode which is placed opposite and displacing the liquid located at the level of the fastening region towards the central zone so as to adjust the radius of curvature of the membrane.

The free end of the leg may be located either opposite the central zone in relation to the foot, or on the side of the central zone, opposite the peripheral anchoring zone in relation to the foot.

To avoid leaks, the film comprises at least one continuous layer that extends over its whole surface.

It is possible that the foot is fixed to the film or forms an integral part of the film.

To increase the efficiency of the electrostatic actuating means while at the same time limiting the size of the membrane, it is possible that the leg is divided on the side of its free end.

It is even possible that the foot has ramifications, a leg stemming from each ramification.

So as to command certain movable parts, at least electrostatic actuating means, it is possible that a foot cooperates with several legs.

It is even possible to provide that the movable parts share a single foot.

The leg may be merged with the movable electrode or, quite the opposite, the movable electrode may be one of the constituents of the leg.

The membrane may further comprise a conductive path connected to the movable electrode that runs on the film.

In order to render the mechanical stress caused during the actuation of the electrostatic actuating means as symmetrical as possible, it is possible that the conductive path is divided on the film into two strands, substantially symmetrical in relation to the leg.

In order to improve the efficiency of the actuation, the film may comprise at the level of the intermediate zone a reinforced region at the level of which the foot is fastened to the film.

With the same aim, it is possible that the film comprises a zone with increased flexibility between the anchoring zone and the intermediate zone.

Again with the same aim, it is possible that the film comprises a reinforcement zone between the central zone and the intermediate zone.

To gain in compactness without losing efficiency, it is possible that the leg comprises several segments placed end to end, extending in different directions.

A mechanical device may be provided to fix the foot to the film.

The free end of the leg can extend beyond the edge of the film.

The film may be formed from organic materials chosen from polydimethylsiloxane (PDMS), polymethyl methacrylate (PMMA) polyethylene terephthalate (PET), polycarbonate (PC), parylene, epoxy resins, inorganic materials chosen from silicon dioxide, silicon nitride, germanium, metallic materials chosen from titanium, titanium nitride, aluminium, indium tin oxide (ITO). More generally, the constituent materials of the film must confer on it the mechanical properties described hereafter as well as the optical properties adapted to the application, in other words a transmission or reflection application.

In the same way, the movable part of the electrostatic actuating means may be formed from organic materials chosen from polydimethylsiloxane (PDMS), polymethyl methacrylate (PMMA) polyethylene terephthalate (PET), polycarbonate (PC), parylene, epoxy resins, inorganic materials chosen from silicon dioxide, silicon nitride, germanium, metallic materials chosen from titanium, titanium nitride, aluminium, indium tin oxide (ITO), gold, chromium. More generally, the constituent materials of the movable part of the actuating means must confer on it the electrical and mechanical properties described hereafter.

It is possible that the fixed electrode cooperates with one or more movable electrodes.

To avoid the risks of short-circuit, in working position the movable electrode is spaced from the fixed electrode by at least one electrically insulating material.

The leg may be designed sufficiently rigid so that in working position the movable electrode is without mechanical contact with the support.

The movable part of the electrostatic actuating means may be in contact with the liquid or without contact with the liquid.

Still with the aim of avoiding a short-circuit, it possible that the movable part of the electrostatic actuating means comes, in working position, into mechanical contact against at least one dielectric stop.

To improve the efficiency of the command of the electrostatic actuating means, the optical device may further comprise control means of the electrostatic actuating means as a function of the spacing existing between the movable electrode and the fixed electrode.

To facilitate the energy supply of the movable part of the electrostatic actuating means, it is possible that the optical device comprises, moreover, at least one fixed sacrificed leg, the free end of which is fastened to the support, this fixed sacrificed leg being intended to be connected to an energy source and to supply via the foot to which it is connected at least one movable electrode of a movable part.

To avoid risks of leakage, the film of the membrane may be anchored to the support by mechanical anchoring means.

The optical device may be a liquid lens with variable focal distance, a liquid lens with optical aberration correction in adaptive optics, a mirror with deformable membrane.

The present invention also relates to a method of producing an optical device with deformable membrane in which:

on an initial substrate, a first sacrificial mould is formed, a deformable film of the membrane is deposited on the sacrificial mould so that a peripheral anchoring zone of the film is anchored on the support, at least one conductive path is formed that runs on the film intended to supply with energy at least one conducting movable part formed later of electrostatic actuating means, a second sacrificial mould for the movable part of the electrostatic actuating means is formed, this second sacrificial mould extending on the film and on the substrate, the movable part having to have a foot fastened to the film of the membrane in an intermediate zone situated between the anchoring zone and a central zone, the movable part is deposited on the second sacrificial mould, the second sacrificial mould is eliminated so as to free a leg of the movable part having a free end and an end connected to the foot, the movable part and the film are protected with a protection device transferred onto the substrate, a fixed electrode facing the movable part is formed, the first sacrificial mould is eliminated by means of an access through the substrate or the membrane, a liquid is trapped between the film and the protection device or in the place of the first sacrificial mould.

The conductive path may be connected electrically by means of a metallized hole traversing the initial substrate to a contact pad situated opposite the film in relation to the initial substrate.

When the movable part is located in the liquid, the fixed electrode may be formed on the protection device which is a transparent substrate provided with walls delimiting a cup for the liquid and fixed to the initial substrate by walls.

When the movable part is located in the liquid, the hole in the substrate serving to eliminate the first sacrificial mould will preferably have at least the size of the central zone.

In an alternative, when the movable part is located opposite the liquid in relation to the film, the fixed electrode may be formed on a dielectric layer which bears the initial substrate before depositing the film so that the film covers the fixed electrode.

When the movable part is located opposite the liquid in relation to the film, the protection device is preferably a transparent cap.

BRIEF DESCRIPTION OF DRAWINGS

The present invention will be better understood on reading the description of embodiment examples given purely by way of indication and in no way limiting and by referring to the appended drawings, in which:

FIGS. 6A to 6Q show in section different embodiments of a membrane of the optical device according to the invention;

Figure 1A:
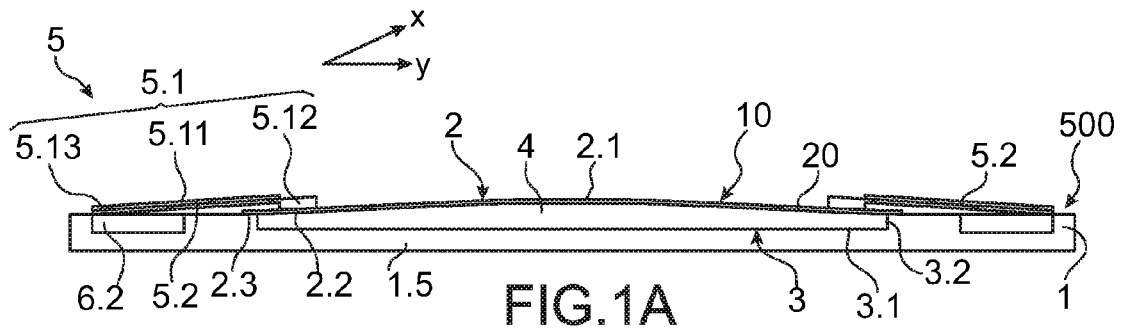
FIGS. 1A to 1F show different alternatives of an optical device according to the invention in rest position and in working position.

Identical, similar or equivalents parts of the different figures described hereafter bear the same numerical references in order to make it easier to go from one figure to the next.

The different parts represented in the figures are not necessarily to a uniform scale, in order to make the figures easier to read.

DETAILED DESCRIPTION OF SPECIFIC EMBODIMENTS

Two embodiments of the membrane 2 of an optical device object the invention will now be discussed, while referring to FIGS. 1A, 1B, 1C, 1D, 1E 1F. The membrane 2 comprises a flexible film 20 having at least three separate zones among which a peripheral anchoring zone 2.3 intended to be anchored in a leak tight manner on a support 1. There is also a central zone 2.1 that it is aimed to deform to adjust the radius of curvature of the membrane and vary the focal distance if the optical device is a liquid lens 4, to correct the optical aberrations if it is a lens with optical aberration correction or to vary an angle of reflection if it is a mirror. Finally, an intermediate zone 2.2 may be distinguished between the central zone 2.1 and the peripheral anchoring zone 2.3.

The support 1 and the membrane 2 entrap a liquid 4. In the example, the support 1 is a substrate provided with a cup 3 intended to contain a constant volume of the liquid 4. The support 1 extends along a principal plane x,y. The cup 3 has a bottom 3.1 and an edge 3.2.

When the optical device is a lens 10, an optic beam (not represented) is intended to traverse the lens 10, while propagating through the membrane 2, the liquid 4 and the support 1 at the level of the bottom 3.1 of the cup 3. The cup 3 is not necessary, the support 1 could be a substantially flat substrate as described in FIGS. 14A to 14M.

The bottom 3.1 is transparent to the optic beam used. The support 1 may be monolithic as in FIG. 1 or be formed by a frame assembled to a bottom as in FIG. 13M. The optic beam traverses the membrane 2 at the level of the central zone 2.1 again called optical field. The central zone 2.1 is transparent. It is very obvious that the optically useful zone used in the central zone may be less than the whole surface of the central zone 2.1.

Hereafter, sometimes the expression central zone 2.1 sometimes the expression optical field is employed for this zone of the membrane 2.

The liquid 4, the volume of which is constant, may be propylene carbonate, water, a refractive index liquid, an optical oil or instead an ionic liquid. It is chosen especially for its optical properties in the case of a liquid lens, such as its optical index for an optical device operating in transmission.

If the optical device was a mirror with deformable membrane, the membrane would be reflecting, since such a membrane is intended to reflect an incident optic beam. The optical field would not be transparent.

The membrane 2 comprises a flexible film 20 acting as barrier between the liquid 4 and a fluid medium located on the other side of the barrier in relation to the liquid 4. This fluid may be quite simply air or another gas or even another liquid. The membrane 2, at least in the central zone 2.1, has a principal face in contact with the liquid 4 and another face in contact with the fluid, this other face forms a dioptre. The material of the membrane 2 is chosen so that it can withstand exterior stresses such as the expansion of the liquid 4, impacts, the weight of the liquid due to gravity, without degrading the membrane in an irreversible manner.

Figure 1B:
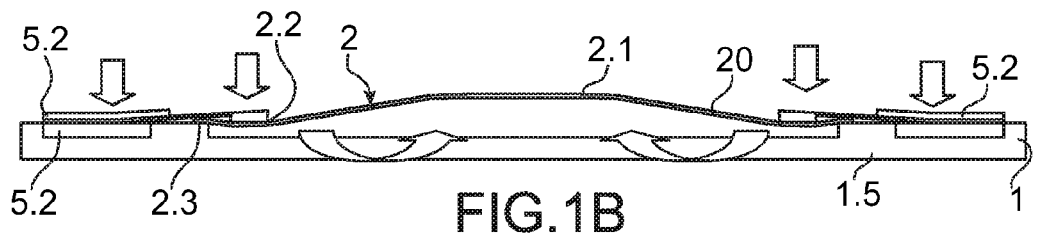
Figure 1C:
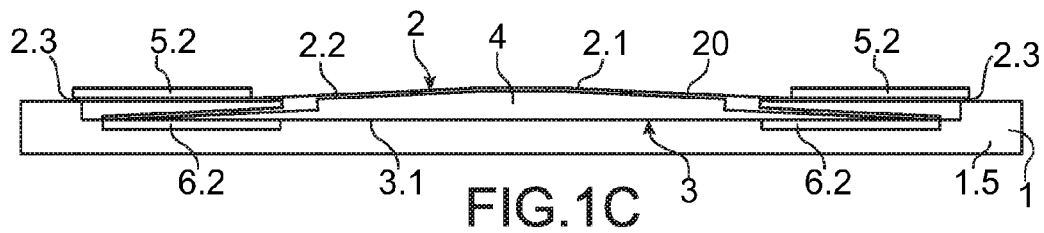
Figure 1D:
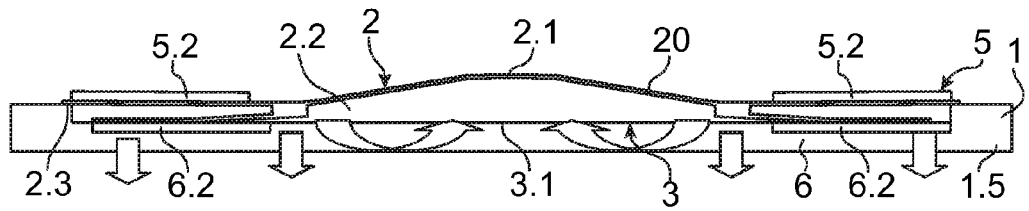
Figure 1E:
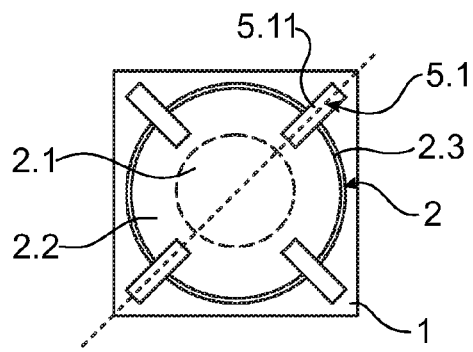
Figure 1F:
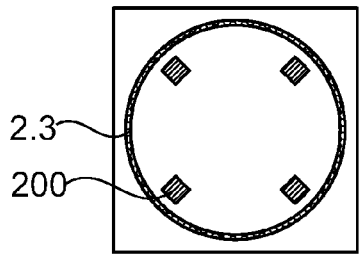

The membrane 2 is represented circular in FIGS. 1E, 1F but other shapes may be envisaged.

The membrane 2 comprises at least one movable part 5.1 of electrostatic actuating means 5 intended to deform the membrane 2 during their actuation. The electrostatic actuating means 5 are formed of one or more electrostatic actuators 500 each comprising a fixed electrode 6.2 fastened to the support 1 and a movable part 5.1 borne by the film 20 of the membrane 2 incorporating a movable electrode 5.2.

Each movable part 5.1 comprises a leg 5.11 terminating at one end in a foot 5.12 fastened to the film 20 at the level of a fastening region 200 located in the intermediate zone 2.2 of the membrane 2. The leg 5.11 terminates at the other end in at least one free and movable end 5.13. The leg 5.11 incorporates at least on the side of its free end 5.13 a movable electrode 5.2. The movable electrode 5.2 may be merged with the leg or be one of the constituents of the leg. The leg 5.11 projects out from the foot 5.12 to the edge of the membrane 2. The leg 5.11, save for its foot 5.12, is substantially parallel to the membrane 2. Its free end 5.13 may extend beyond the edge of the membrane 2 but this is not an obligation as illustrated in FIGS. 1C, 1D. More generally, its free end 5.13 is situated opposite the central zone 2.1 in relation to the foot 5.12. At rest, the free end 5.13 may be in contact or not with the support 1. In so far as the electrostatic actuating means 5 comprise several electrostatic actuators 500, the latter may be spread out substantially regularly around the membrane 2. This enables the deformation of the central zone 2.1 of the membrane 2 to be as uniform as possible.

To do this, the electrostatic actuators 500 will be placed, preferably, in a symmetrical manner in order to respect the symmetry of the optical field.

Nevertheless, when for an application in adaptive optics, this property is not sought and the location of the feet 5.12 will not respect the symmetry of the optical field.

In the example of a circular membrane 2, as illustrated in FIGS. 1E, 1F, the legs 5.11 are arranged radially. In FIG. 1F is represented the fastening regions 200 of the feet 5.12 on the film 20 of the membrane 2.

During the actuation of the electrostatic actuating means 5, from a rest position to a working position, the movable electrode 5.2 is attracted by the fixed electrode 6.2. In FIG. 1, FIG. 1A and FIG. 1C correspond to the rest position and FIGS. 1B, 1D correspond to a working position.

The actuation takes place when a potential difference of appropriate value is applied between the movable electrode 5.2 and the fixed electrode 6.2 of an actuator 500. This potential difference is called actuation voltage. The movable electrode 5.2 is placed opposite the fixed electrode 6.2. The leg 5.11 on which is located the movable electrode 5.2 is sufficiently deformable to be able to bend during the actuation. The movable electrode 5.2 can come alongside or flatten itself against an insulator 7 separating it from the fixed electrode 6.2, the movement of the movable electrode 5.2 and thus of the leg 5.11 taking place progressively and almost linearly with the applied voltage. This actuation is described as "zipping" type actuation or progressive closing or zip or slide closing.

In an alternative, the movable electrode 5.2 may only come closer to the fixed electrode 6.2 without there being this coming alongside.

During actuation, the foot 5.12 in which the leg 5.11 terminates transmits a stress to the film 20 of the membrane 2, which enables its displacement in the intermediate zone 2.2, this displacement expels the liquid 4 located under the membrane 2 at the level of the fastening region 200 of the foot 5.12 and leads to a deformation of the central zone 2.1 of the membrane 2 and thus a change in the radius of curvature of the dioptre. This deformation aims to vary the focal distance of the membrane 2, to correct the aberrations or to deform the mirror depending on the application of the membrane.

Each movable part 5.1 is located either on the face of the membrane 2 in contact with the liquid 4 as illustrated in FIGS. 1C, 1D or on the other face as illustrated in FIGS. 1A, 1B.

The mechanical fixation of the movable parts 5.1 on the film 20 of the membrane 2 has the aim of improving the efficiency of the actuation compared to a system where the electrostatic actuating means locally compress the membrane 2. Efficiency is taken to mean that a greater deformation is obtained, in other words a greater variation of focal distance for a given energy input.

Provision is made so that the fixed electrode 6.2 and the movable electrode 5.2 do not come into direct contact with each other, which would cause a short-circuit.

When the leg 5.11 and the movable electrode 5.2 that is incorporated in it are located on the face of the membrane 2 opposite the liquid 4, the membrane 2 may serve as dielectric to isolate the two electrodes 5.2, 6.2. In an alternative or in combination, the two electrodes 5.2, 6.2 may remain in working position, kept apart from each other by the fluid medium located on the other side of the membrane 2 in relation to the liquid 4. In this case, the leg 5.11 is sufficiently rigid so that it remains "in the air". It physically comes up against nothing in working position.

Figure 4A:
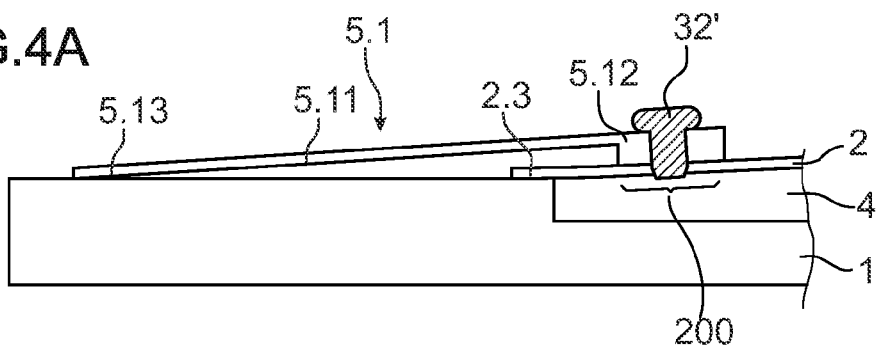
FIGS. 4A to 4E show different alternatives of movable parts of the membrane.
Figure 4B:
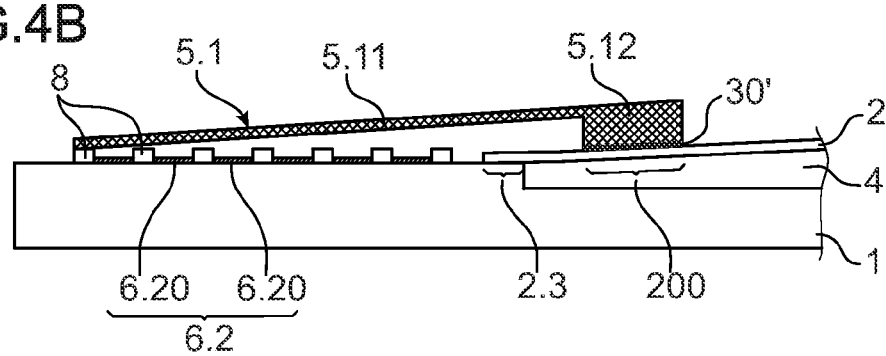
Figure 4C:
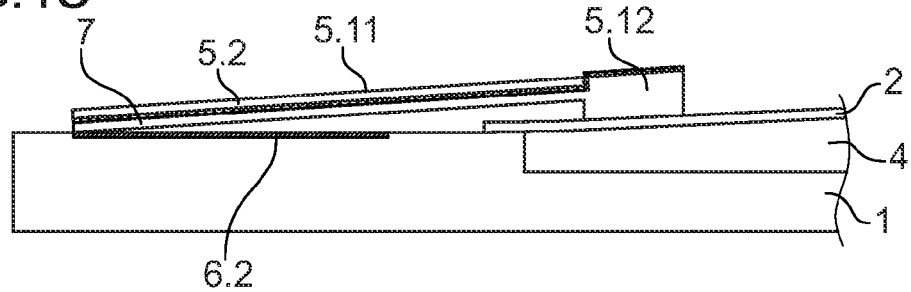
Figure 4D:
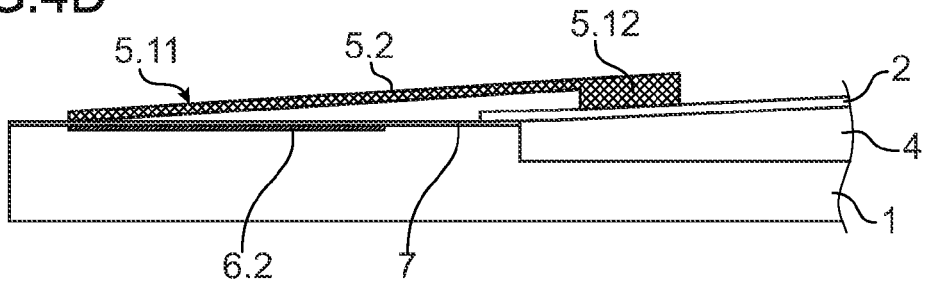

It is obviously possible that the insulator 7 can hug the shape of an insulating part that covers the movable electrode 5.2, the fixed electrode 6.2 or both. This insulating part 7 may be embarked on the leg 5.11 and participate or not in its rigidity as in FIG. 4C. The insulating part 7 may concern the fixed electrode 6.2 as in FIG. 4D. In other words, in addition to the ambient fluid expelled during the electrostatic attraction of the movable electrode 5.2 at least one other dielectric permanently separates the two electrodes 5.2, 6.2. It is assumed that in FIG. 4D, the leg 5.11 of the movable part 5.1 is limited to the movable electrode 5.2 and that in FIG. 4B the movable electrode 5.2 and the whole movable part 5.1, in other words foot 5.12 and leg 5.11, are merged. In FIG. 4C, the leg 5.11 comprises both the movable electrode 5.2 and the insulating part 7 as coating. The insulating part 7 may occupy the greater part of the movable part 5.1 and give its shape to the leg 5.11.

The movable electrode 5.2 may be made of a metallic material such as titanium nitride, gold, a chromium/gold stack, aluminium. The thickness of the movable electrode 5.2 lies within a bracket ranging from several nanometres to around several tens of micrometres. Concerning the dielectric of the insulating part 7, if it is embarked on the leg 5.11, numerous materials may be used and in particular the dielectric inorganic materials employed to form the membrane 2 such as silicon dioxide or silicon nitride. The thickness of the dielectric material of the leg 5.11 lies in a bracket ranging from several nanometres to around several tens of micrometres. If the movable electrode 5.2 and the leg 5.11 are merged, a same thickness bracket may be conserved.

When the movable part 5.1 is bathed by the liquid 4, the latter may be dielectric. It will be chosen so that it has an appropriate breakdown voltage and dielectric constant. In the case evoked above and illustrated in FIGS. 1A, 1B, the liquid 4 does not need to have dielectric properties.

Another possibility is to provide for one or more dielectric stops 8 aiming to prevent the fixed and movable electrodes 5.2, 6.2 entering into direct mechanical contact. Reference may be made to FIG. 4B. The dielectric stops 8 are borne by the support 1 at the level of the fixed electrode 6.2, but they could have been borne by the leg 5.11 of the movable part 5.1 or be spread out between the support 1 and the leg 5.11. In this FIG. 4B, the fixed electrode 6.2 comprises several portions 6.20 and several dielectric stops 8 that form an alternating succession. These portions of electrodes 6.20 and these stops 8 may be circular or arc of circle and concentric.

The membrane 2 will now be described in a more detailed manner, beginning with its film 20.

In a minimalist version, the membrane or more precisely its film 20 comprises three zones as has already been stated. The central zone 2.1, corresponding to the optical field in a lens application. The film 20 is formed of at least one continuous layer 20.1 which extends over its whole surface.

The dimensioning of the membrane 2 is guided by the behaviour that it will have in the central zone 2.1, since the variation of the focal distance or the curvature of the optical device depends directly on the displacement of the central zone 2.1.

The central zone 2.1 of the membrane 2 is sufficiently flexible and elastic to be able to deform in a reversible manner when it is activated by the displacement of the feet 5.12 of the movable parts 5.1 of the electrostatic actuators 500.

Figure 2A:
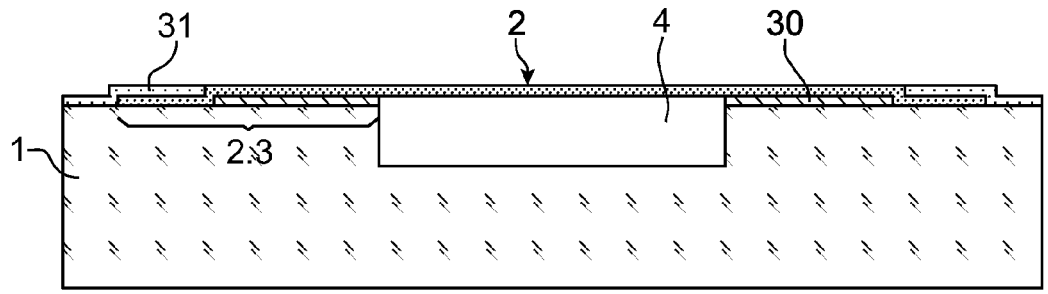
FIGS. 2A, 2B show details of the anchoring of the membrane to the support.
Figure 2B:
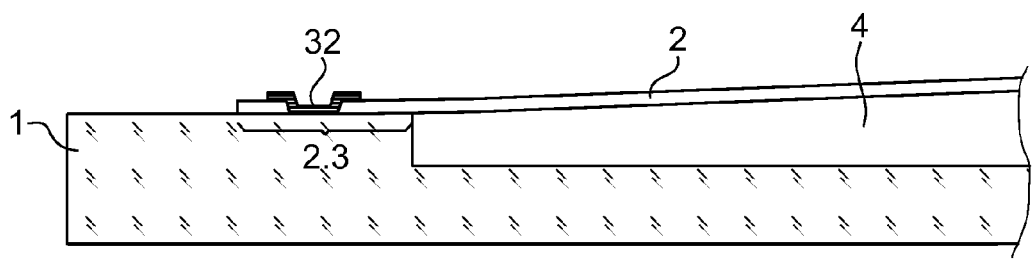

The anchoring zone 2.3 of the membrane 2 must be fixed in a leak tight manner to the support 1 so as to avoid any leak of liquid 4 or any entry of surrounding fluid under the membrane 2. The adhesion between the anchoring zone 2.3 and the support 1 is a determining parameter for this zone. Its adhesion is sufficient to withstand the stresses induced by the displacements of the central zone 2.1 and the intermediate zone 2.2 while ensuring leak tightness. To attain the requisite adhesion, it is possible to insert an adhesion primer 30 between the anchoring zone 2.3 of the membrane 2 and the support 1 as illustrated in FIG. 2A. In this figure, the adhesion primer 30 only extends partially on the anchoring zone 2.3 of the membrane 2. It is entirely possible that it extends over the whole anchoring zone 2.3. In an alternative or in combination, it is possible to coat the anchoring zone 2.3 at least partially with a coating 31 that also extends on the support 1 beyond the film 20 of the membrane 2 as illustrated in FIG. 2A. Another configuration is shown in FIG. 2B, a mechanical fixation device 32 is provided such as one or more rivets 32 that maintain the anchoring zone 2.3 to the support 1, they cross the anchoring zone 2.3 and penetrate into the support 1.

In order to optimise the adhesion of the anchoring zone 2.3 on the support 1, it is possible to provide for a prior treatment of the support 1 before the fixation. It will be possible, for example, to carry out a surface treatment with a plasma for example of oxygen or instead carry out a deposition with a layer of adhesion primer material. In FIG. 2, the movable parts 5.1 of the electrostatic actuating means have not been shown so as not to clutter the figures.

The intermediate zone 2.2 will now be described. It is in this intermediate zone that are located the fastening regions 200 of the movable parts 5.1 of the electrostatic actuating means 5. The membrane 2 may ensure a continuity with the feet 5.12 of the movable parts 5.1 as illustrated in FIGS. 1C, 1D or, quite the opposite, the feet 5.12 may be transferred onto the film 20 of the membrane 2 as illustrated in FIGS. 1A, 1B. In both cases, it is possible to define on the film 20 the fastening region 200, it corresponds to the coverage that a foot 5.12 of the movable parts 5.1 has on the film 20. The intermediate zone 2.2 may be at least locally more rigid than the central zone 2.1 but it is not an obligation. The fastening region may be divided up into portions 200.1.

The number of portions 200.1 of the fastening region 200 does not necessarily correspond to the number of movable parts 2.1 as illustrated in FIGS. 3A to 3F. FIGS. 3A to 3F show alternatively on the one hand a membrane 2 of an optical device according to the invention, top view with the film 20, the movable parts 5.1 and on the other hand only the different parts of the film 20 of the membrane 2 illustrated in the previous figure and especially the fastening region 200.

Figure 3A:
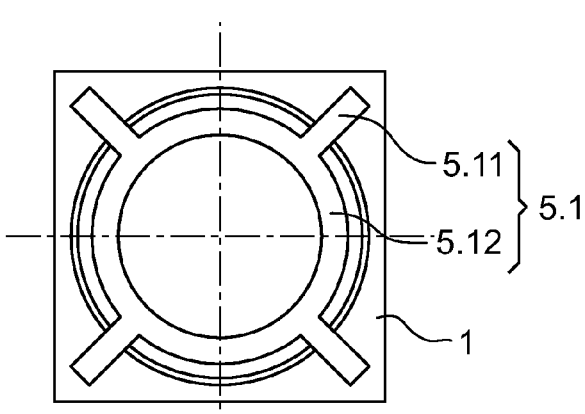
FIGS. 3A to 3I show in top view membranes of optical devices and the fastening region of the feet of their movable parts.
Figure 3B:
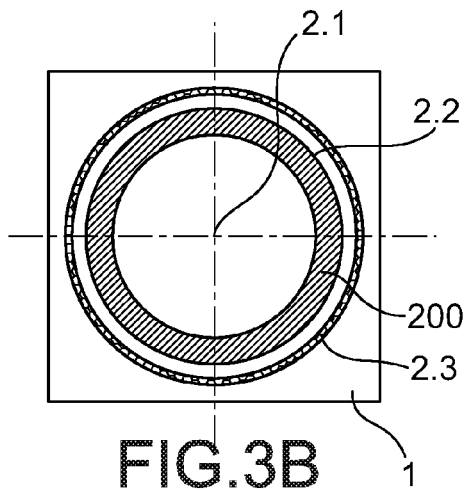

In FIG. 3A, four movable parts 5.1 with four radial legs 5.11 but a single foot 5.12 common to all the legs 5.11 may be distinguished. The fastening region 200 is continuous in crown shape as illustrated in FIG. 3B.

Figure 3C:
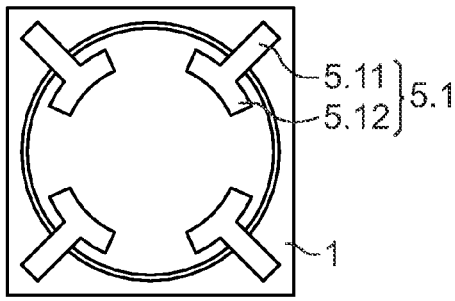
Figure 3D:
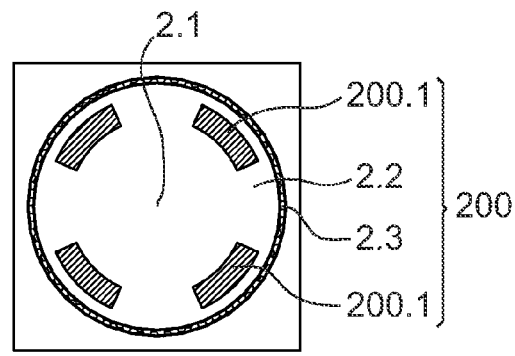

In FIGS. 3C, 3D there are still four movable parts 5.1 with four radial legs 5.11 but each leg 5.11 cooperates with a foot 5.12 that is specific to it. The fastening region 200 is subdivided into four crown portions 200.1.

Figure 3E:
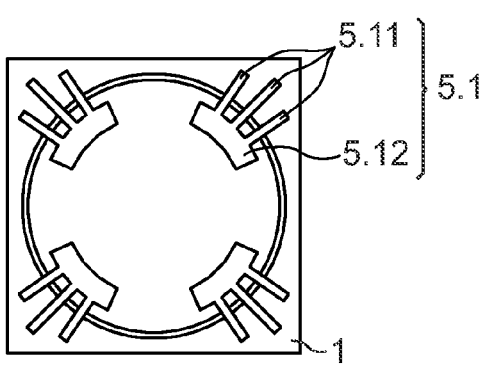
Figure 3F:
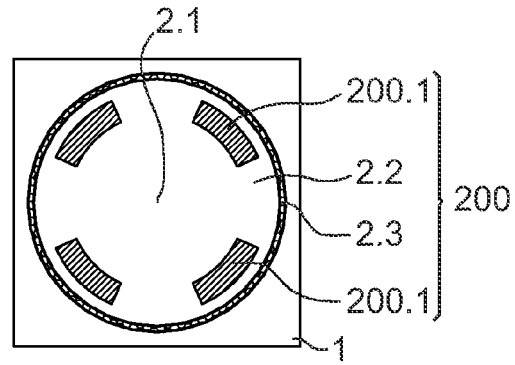

In FIGS. 3E, 3F there are now twelve movable parts 5.1 and thus twelve legs 5.11, divided into four groups, each group having a common foot 5.12. The fastening region 200 is sub-divided into four crown portions 200.1 as in the previous case.

The examples given are not limitative, more or indeed less movable parts could be used.

Preferentially, the number of movable parts 5.1 and their location are chosen in such a way as to respect the symmetries of the membrane 2 symbolised by the dotted line axes in FIGS. 3A to 3F.

Figure 3G:
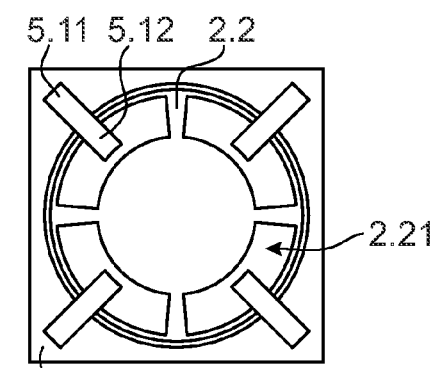
Figure 3I:
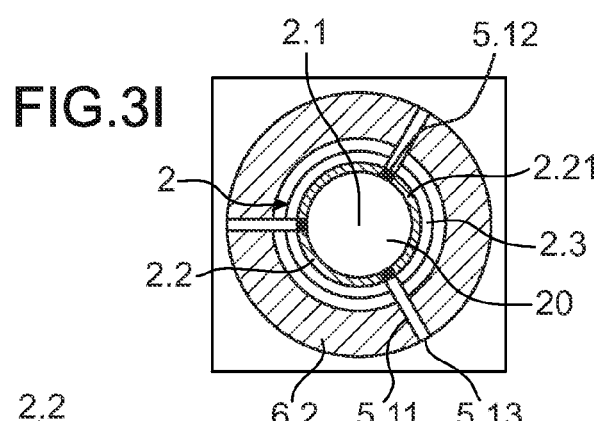
Figure 3H:
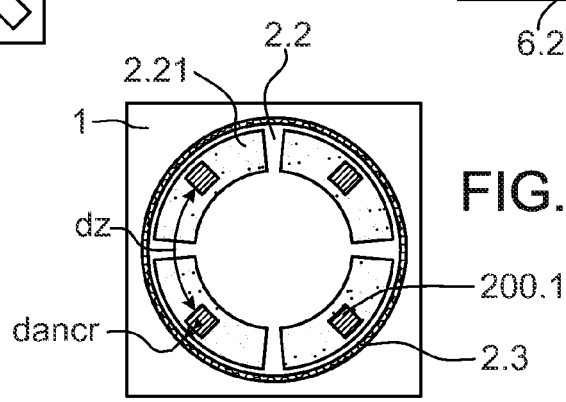

Nevertheless, the location of the movable parts 5.1 cannot respect this symmetry if the intermediate zone 2.2 is more rigid than the central zone 2.1 and than the anchoring zone 2.3 as illustrated in FIGS. 3G to 3I. In FIGS. 3G and 3H, the intermediate zone 2.2 comprises a reinforced region 2.21 divided up into separate reinforced portions 2.211. The rigidity of the intermediate zone 2.2 is greater than the central zone 2.1. The reinforced portions 2.211 are crown portions. There are four radial movable parts 5.1, each being provided with a foot 5.12. The fastening region 200 of the feet 5.12 is located at the level of a reinforced portion 2.211, and more particularly in a substantially central location of the reinforced portion 2.211. The surface of a fastening region 200 is less than that of a reinforced portion 2.211. In FIG. 3I, there are three movable parts 5.1 shifted substantially 120°, they each have a foot 5.12 that is specific to them, the reinforced region 2.21 is continuous and takes the form of a crown.

The reinforced region 2.21 renders the film 20 locally sufficiently rigid to pass onto the liquid 4 the pressure applied by the feet 5.12 and thus generate the requisite displacements of the liquid 4.

The reinforced region 2.21 that marks out the central zone 2.1 thus makes it possible to increase the displacements of liquid 4 for a given actuating force of the electrostatic actuating means 5.

In so far as the movable part 5.1 of the electrostatic actuating means 5 is transferred onto the membrane 2, the notion of adhesion between the foot 5.12 and the film 20 is essential, especially if the foot 5.12 pulls on the film 20 and the movable part 5.1 is placed under the membrane 2 in the liquid 4.

In the case where the adhesion of the membrane 2 is sufficient, it can on its own guarantee the requisite mechanical fixation for the foot 5.12. If this is not the case, it is possible to introduce an adhesion primer 30' between the foot 5.12 and the fastening region 200 as illustrated in FIG. 4B. Another configuration is to use a mechanical fixation device of the foot such as one or more rivets 32' as shown in FIG. 4A. The rivet 32' represented traverses the foot 5.12 and the film 20. There is no risk of leakage if the rivet 32' fulfils its function, which is to improve the fixation between the membrane 2 and the foot 5.12.

At the level of the fastening region 200 the displacement of the membrane 2 during the actuation of the electrostatic actuating means 5 induces movements of the liquid 4 behind the operation of the optical device including the membrane 2. The surface of the fastening region 200 and its distribution on the membrane 2 are as many determining parameters for the displacement of the central zone 2.1.

The mechanical behaviour of the membrane 2 depends especially on the surface of the fastening region 200 and the reinforced region 2.21 if it exists. Provision is made so that the rigidity of the membrane 2 in the optical field 2.1, in other words the parameters E (Young's modulus of the constituent material of the central zone 2.1), v (Poisson coefficient of the constituent material of the central zone 2.1), h (thickness of the central zone 2.1) and R (radius of the central zone 2.1) is in keeping with these regions and with the force that the electrostatic actuating means 5 develop. Indeed, the pressure exerted by the liquid 4 on the optical field 2.1 multiplied by the total surface of the membrane 2 in contact with the liquid 4 is equal, as a first approximation in considering the liquid 4 as incompressible, to the force developed by the electrostatic actuating means 5. Such an approach makes it possible to extract an order of magnitude of the force to develop by the electrostatic actuating means.

The mechanical behaviour of the membrane 2 in the optical field 2.1 thus depends on the maximum deflection h of the membrane 2, the force applied by the electrostatic actuating means 5, their range of movement and, if appropriate, the fixation surface which corresponds to the surface of the fastening region 200. More specifically, the bending rigidity of the membrane 2 in the optical field, which depends on the parameters E, v, h, R, must be adapted with the fastening surface and the force exerted by the electrostatic actuating means.

Figure 4E:
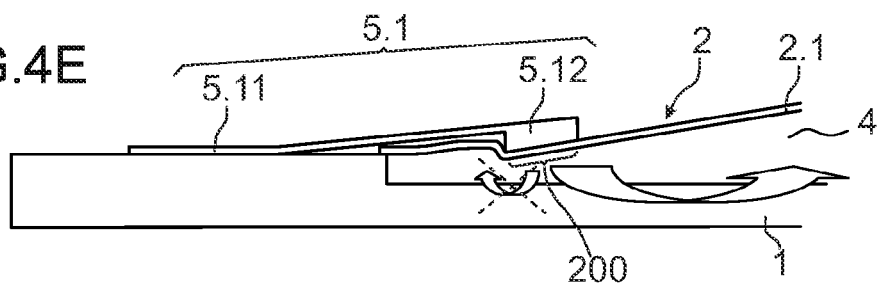

When the fastening region 200 comprises several portions 200.1, the distance $d_z$ separating two consecutive fastening portions 200.1 which follow each other around the central zone 2.1 must not be too great otherwise there is a risk of undesired local deformations of the film 20 of the membrane 2 occurring which can perturb the operation of the optical device incorporating the membrane 2. Finally, the distance $d_{ancr}$ between the fastening region 200 of the feet 5.12 and the anchoring zone 2.3 to support 1 is also important. This distance $d_{ancr}$ must not be too small given the rigidity of the central zone 2.1 because if not the travel of the electrostatic actuating means 5 is hindered and the displacement of the liquid 4 is not optimal. This distance $d_{ancr}$ must not be too great given the rigidity of the central zone 2.1 because if not too much liquid 4 will be expelled towards the edge of the membrane 2 and this takes place to the detriment of the quantity of liquid 4 expelled towards the central zone 2.1. FIG. 4E illustrates this latter case. Typically a compromise will be reached when the bending rigidity of the fastening region 200 is greater than the bending rigidity of the central zone 2.1.

If a reinforced region 2.21 has been provided, what has just been stated for the fastening region 200 applies to the reinforced region 2.21.

Figure 5A:
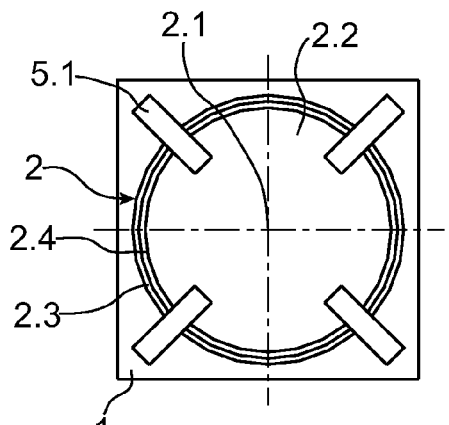
FIGS. 5A to 5D show in top view different membrane alternatives with particular geographic zones in addition to the anchoring, intermediate and central zones.
Figure 5B:
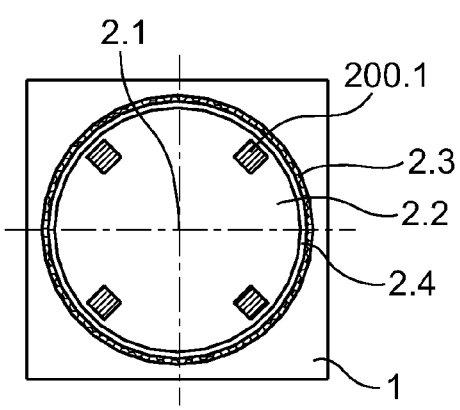

In order to facilitate the displacement of the fastening region 200 and/or the reinforced region 2.21 if it exists, a peripheral zone with increased flexibility 2.4, more flexible than the central zone 2.1, may be laid out between the anchoring zone 2.3 and the intermediate zone 2.2. This peripheral zone with increased flexibility 2.4 may be continuous or divided up into several portions. Reference may be made to FIGS. 5A, 5B which show this peripheral zone with increased flexibility 2.4 continuous in crown shape.

Figure 5C:
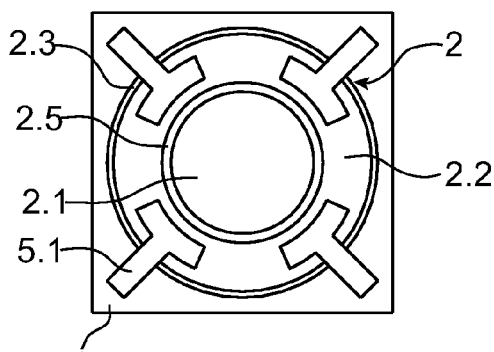
Figure 5D:
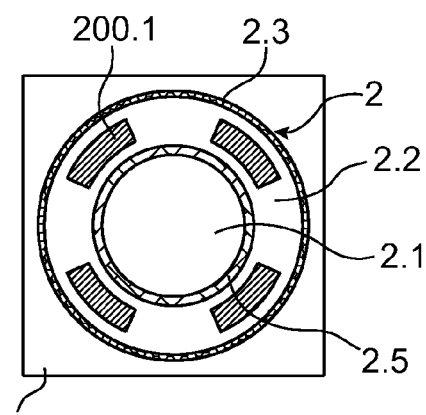

In order to standardise the deformation of the film 20 of the membrane 2 in the central zone 2.1 and thereby increase the performance of the optical device incorporating the membrane 2, it is possible to provide a reinforcement zone 2.5 inserted between the central zone 2.1 and the intermediate zone 2.22. This reinforcement zone 2.5 has a rigidity greater than that of the central zone 2.1. The feet 5.12 of the movable parts 5.1 do not put a strain on it directly since it is not in the intermediate zone 2.2. It is preferably continuous in crown shape as illustrated in FIGS. 5C, 5D, but it could be divided up into several portions.

Different structures of membrane 2 of optical devices according to the invention will now be examined, while referring to FIGS. 6A to 6Q. These different configurations are not exhaustive. These figures show sections of the membrane 2. In these figures, the movable part 5.1 of the electrostatic actuating means 5 is overlying the film 20 of the membrane 2. It is obviously possible that this movable part 5.1 is underlying the film 20 of the membrane 2 and equivalent configurations may be envisaged. The profile of the membrane 2 strongly influences the shape of the central zone 2.1, by varying the thicknesses of the different zones it is possible to optimise the shape of the dioptre of the lens which has such a membrane 2.

The membrane 2 may have a monolayer film 20 as in FIGS. 6A to 6E, 6I, 6J, 6O or multilayer as in FIGS. 6F to 6H, 6K to 6N, 6P, 6Q but in all cases a layer 20.1 of film 20 extend in a continuous manner over its whole surface. The risks of leakages are reduced since several parts placed alongside each other are not going to be assembled in the manner of a patchwork as in the prior art. In FIGS. 6A, 6B, the continuous layer 20.1 of the membrane 2 occupies all of the surface of the membrane 2. An interface exists between the film 20 of the membrane 2 and the foot 5.12 of the movable part 5.1 of the electrostatic actuating means 5, the foot 5.12 being more massive in FIG. 6A than in FIG. 6B.

In FIGS. 6C, 6D, the continuous layer 20.1 of the film 20 of the membrane 2 occupies the whole surface of the membrane 2. The foot 5.12 of the movable part 5.1 of the electrostatic actuating means 5 is all in one piece with the continuous layer 20.1. The foot 5.12 is more massive in FIG. 6C than in FIG. 6D. The film 20 is of substantially constant thickness over the whole surface of the membrane 2 in FIGS. 6A to 6D. In FIG. 6E, the film 20 is monolayer but its thickness varies. It is thicker at the centre of the central zone 2.1, its thickness reduces in moving away from the centre of the central zone 2.1, in the intermediate zone 2.2 and in the anchoring zone 2.3 its thickness is substantially constant and this thickness corresponds substantially to the lowest thickness of the central zone 2.1. By varying the thickness of the central zone 2.1 in this way it is possible to modify its deformation and thus change the shape of the dioptre of the lens incorporating the membrane 2.

In FIG. 6F, the continuous layer is formed of a stack of two sub-layers 20.1a, 20.1b. These two sub-layers 20.1a, 20.1b are of substantially constant thickness.

In FIG. 6G, the film 20 of the membrane 2 is multilayer at the level of the fastening region 200 of the feet 5.12 of the movable parts 5.1 of the electrostatic actuating means 5 and monolayer elsewhere.

In FIG. 6H, the film 20 of the membrane 2 is multilayer at the level of the fastening region 200 of the feet 5.12 of the movable parts 5.1 of the electrostatic actuating means 5 and at the level of the anchoring zone 2.3 it is moreover monolayer. In FIGS. 6F to 6H, the different layers have a substantially constant thickness.

In FIGS. 6I and 6J is represented a reinforced region 2.21 in the intermediate zone 2.2 at the level of the fastening region 200 of the feet 5.12. The film 20 of the membrane 2 is monolayer and its thickness is increased at the level of the reinforced region 2.21. The central zone 2.1 and the anchoring zone 2.3 have substantially the same constant thickness. In FIG. 6I, the reinforced region 2.21 extends opposite the face in contact with the liquid 4 and in FIG. 6J it is the opposite.

In FIGS. 6K and 6L, the reinforced region 2.21 is also thickened in relation to the central zone 2.1 and to the anchoring zone 2.3 but now it is multilayer. However, the continuous layer 20.1 that extends over the whole surface of the film 20 of the membrane 2 has a substantially constant thickness.

The film 20 of the membrane 2 of FIG. 6M is comparable to that of FIG. 6K with a multilayer reinforced region 2.21 with the exception of the fact that the continuous layer 20.1 that extends over the whole surface of the film 20 of the membrane 2 is thickened at the level of the reinforced region 2.21. The reinforced region 2.21 is turned opposite the face that has to come into contact with the liquid 4 but it could have been turned on the side of the face that has to come into contact with the liquid 4.

In FIG. 6N, the continuous layer 20.1 of the film 20 is formed of a stack of sub-layers 20.1a, 20.1b, its thickness is substantially constant. At the level of the reinforced region 2.21, at least one additional layer completes the stack, it confers on the reinforced region a greater thickness than that of the remainder of the film 20 of the membrane 2.

In FIG. 6O, the film 20 of the membrane 2 is monolayer, it comprises a peripheral zone 2.4 with increased flexibility, the thickness of which is less than that of the remainder of the film 20 of the membrane 2. The thickness of the continuous layer 20.1 is substantially constant and the same in the anchoring zone 2.3, the intermediate zone 2.2 and the central zone 2.1.

In FIG. 6P, the film 20 is multilayer in the anchoring zone 2.3, the intermediate zone 2.2, the central zone 2.1, these zones having substantially the same structure and the same thickness. In the peripheral zone with increased flexibility 2.4, the thickness of the film 20 is less, it counts fewer layers than in the other zones. As it happens, in the example represented, it is monolayer in this peripheral zone with increased flexibility 2.4.

In FIG. 6Q, the film 20 is monolayer substantially of a same constant thickness in the anchoring zone 2.3, in the intermediate zone 2.2, in the central zone 2.1. A reinforcement zone 2.5, which is multilayer, is provided for. The feet 5.12 of the movable parts 5.1 of the electrostatic actuating means 5 are in once piece with the fastening regions 200 of the feet 5.12.

All of the structures presented in the FIG. 6 may be combined to form even more alternatives.

The central zone 2.1 may thus be composed of a single material or several depending on whether it is monolayer or multilayer. This continuous layer extends over the whole surface of the film 20 of the membrane 2. The elastic limit of the central zone 2.1 is sufficient to guarantee a deformation in the elastic domain and thus a reversibility of the deformation, in other words a return to an initial position once the electrostatic actuating means have finished acting. Numerous materials have both the requisite optical transmission properties, for example in the visible, and elasticity properties. For example organic materials such as polydimethylsiloxane (PDMS), polymethyl methacrylate (PMMA) but also polyethylene terephthalate (PET), polycarbonate (PC), parylene, epoxy resins, the Young's modulus of which is between several 100 MPa and several GPa, may be cited.

Other materials may be suitable and enter into the composition of the film 20. It may be metallic materials such as titanium, titanium nitride, aluminium, indium tin oxide (ITO). Inorganic materials such as silicon dioxide, silicon nitride, germanium may also enter into the composition of film 20.

The thickness of the film 20 or of each of its layers may be between around 10 nanometres and several tens of micrometres for a membrane 2, the diameter of which is of the order of several millimetres.

Figure 7A:
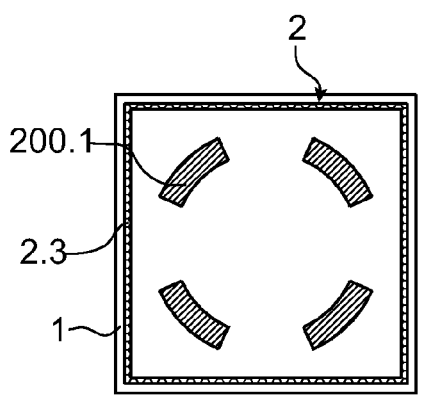
FIGS. 7A, 7B show membranes of optical devices according to the invention which are not circular.
Figure 7B:
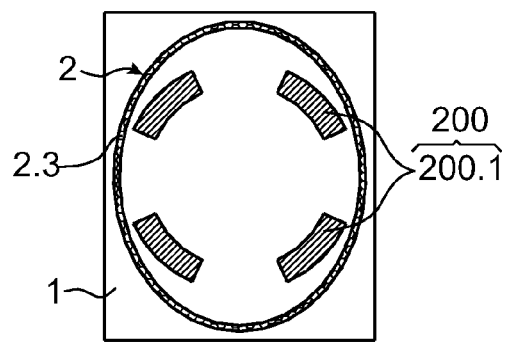

Until now the membrane 2 has been represented circular but it is obviously understood that it may take the shape of a quadrilateral as illustrated in FIG. 7A or that it may be elliptic or more generally oblong as illustrated in FIG. 7B. In these figures, the support 1 takes the form of a quadrilateral but this is not limiting.

Figure 8A:
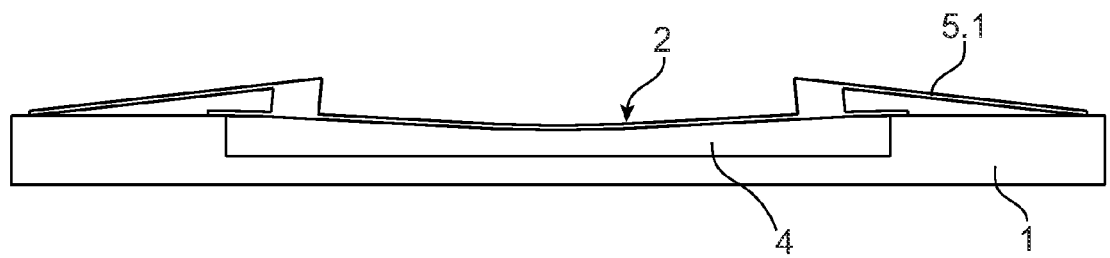
FIGS. 8A, 8B show an optical device according to the invention in rest position and in working position in which the membrane is convex at rest.
Figure 8B:
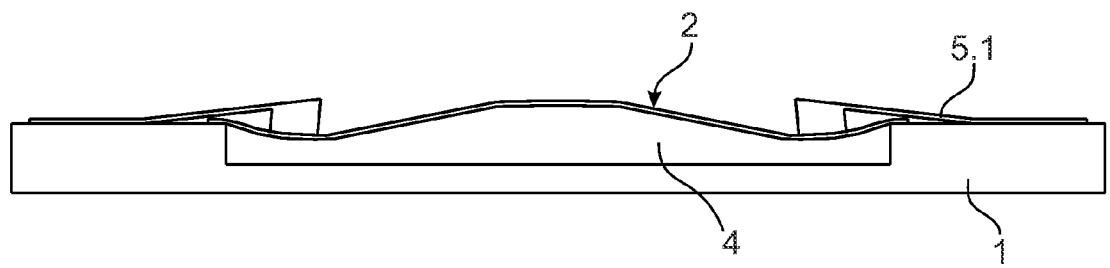

The membrane 2 has always been represented convex when the electrostatic actuating means 5 are at rest. It is obviously possible that the membrane 2 is concave while the electrostatic actuating means 5 are at rest as illustrated in FIG. 8A. FIG. 8B shows the appearance of the membrane 2 when the electrostatic actuating means 5 are in working position. It is possible that the membrane 2 is substantially flat when the electrostatic actuating means are at rest. It will be noted that to properly control the form of the dioptre, whether in rest position of the electrostatic actuating means 5 or in working position, it is preferable that the film 20 is in tension when the electrostatic actuating means 5 are in rest position.

Figure 9A:
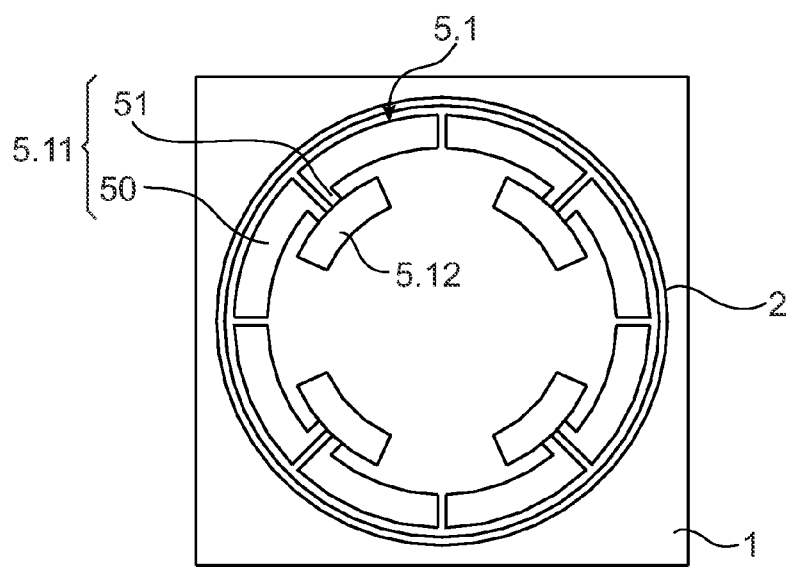
FIGS. 9A, 9B show a membrane of an optical device according to the invention in which the legs of its movable parts are folded

FIG. 9A represents a structure of membrane 2 in which two legs 5.11 cooperate with a single foot 5.12. To increase the surface of the legs 5.11 without increasing the overall surface of the membrane 2, it is possible that the legs 5.11 are folded, they comprise at least two segments 50, 51 directed along different directions and placed end to end. In the example described, a first rectilinear radial segment 51 and a second segment 50 substantially transversal to the first segment 51 and in this example of arc of circle shape are provided. In this example, the movable part 5.1 is seen as transparent through the film 20 because it is fastened to the film of the membrane 2 on its face in contact with the liquid.

Figure 9B:
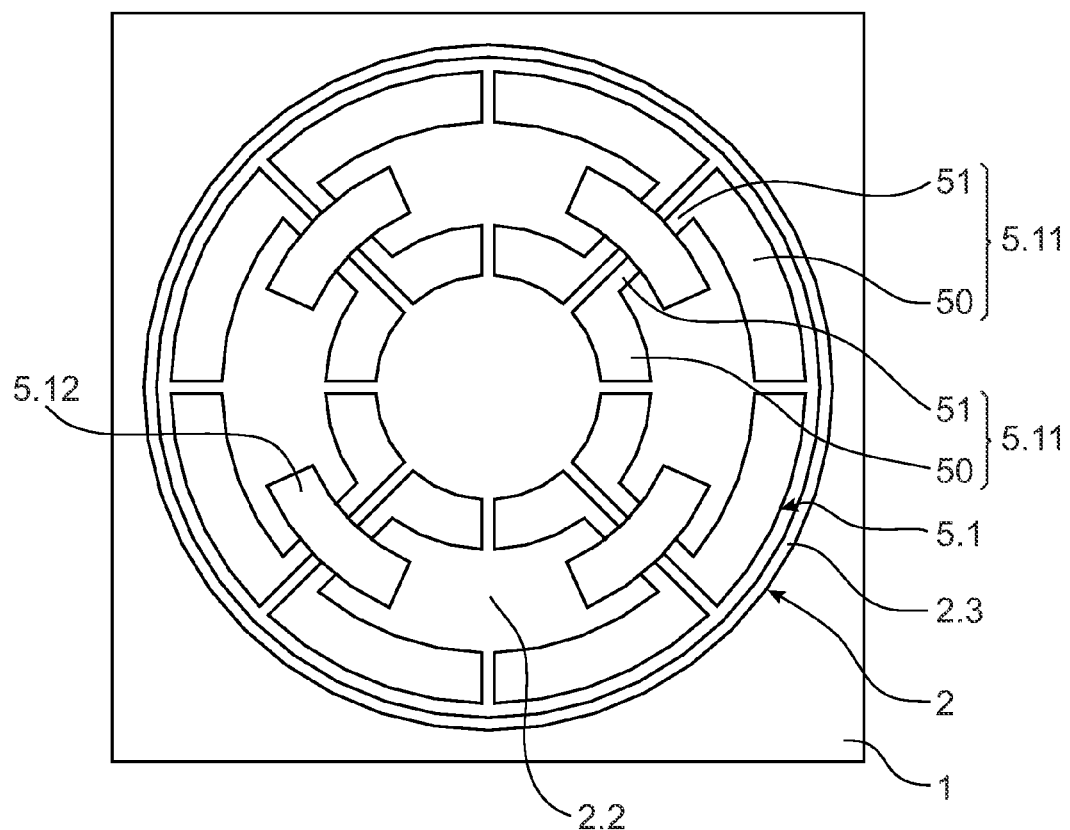
Figure 9C:
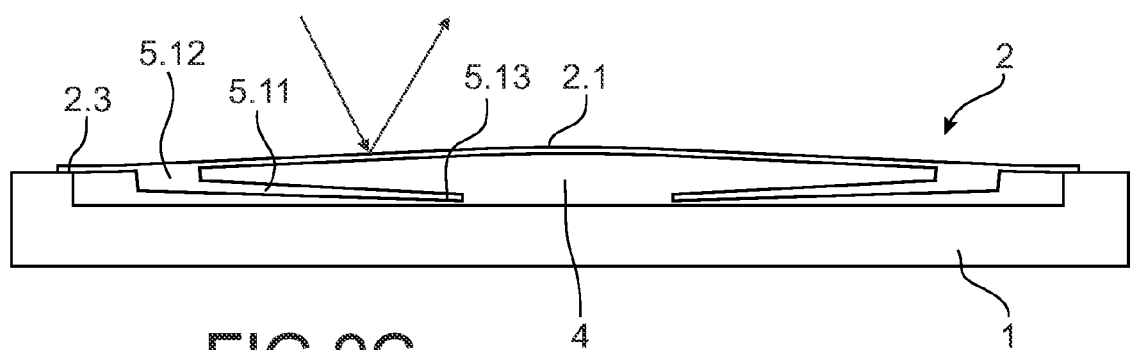
FIG. 9C shows a membrane with one leg, the free end of which is at the level of the central zone.

In FIG. 9B, a membrane structure is represented in which four legs 5.11 cooperate with a single foot 5.12. The geometry of the legs is similar to that of FIG. 9A. For two of the legs 5.11, their end is situated opposite the central zone 2.1 in relation to the foot 5.12, and for two others their end is located on the side of the central zone 2.1 opposite the peripheral anchoring zone 2.3 in relation to the foot 5.12. In this case also, the movable part 5.1 is fastened to the film of the membrane 2 on its face in contact with the liquid. FIG. 9C, which is in section, shows the ends 5.13 of the legs 5.11 that are located in the liquid 4, at the level of the central zone 2.1 of the membrane 2. The legs 5.11 thus configured do not degrade the optical performance of the device because it operates in reflection.

In a device operating in transmission, the legs may extend over the whole surface of the membrane not used optically. In a device operating in transmission, they may extend under the intermediate zone and even under the central zone at a location not used optically. In a device operating in reflection, they may extend over the whole central zone.

Figure 10A:
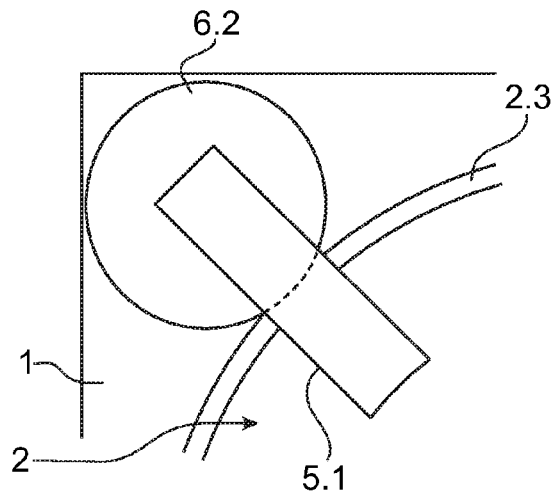
FIGS. 10A, 10B make it possible to compare a movable part, the leg of which is divided, with a movable part, the leg of which is single.
Figure 10B:
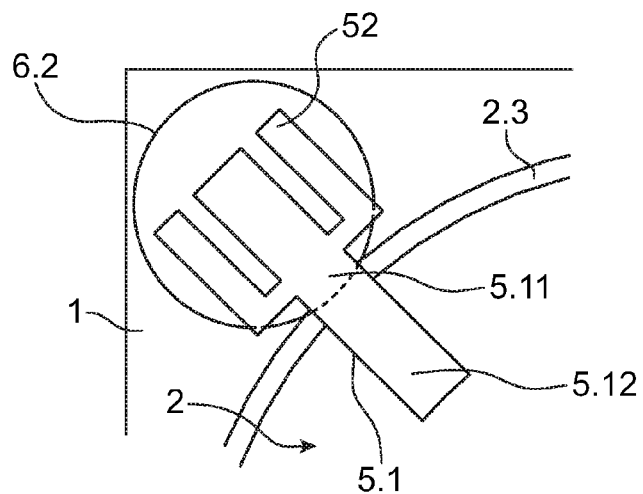

In order to maximise the electrostatic force that is exerted between the movable electrode 5.2 of the movable part 5.1 and the fixed electrode 6.2 borne by the support 1, it is aimed that the intersection between the surfaces of the fixed electrode 6.2 and the movable electrode 5.2 is as large as possible. On the other hand, it is necessary to prevent the movable electrode 5.2 being too rigid, its suppleness is primordial in order to enable the deflection of the leg 5.11 and the optimisation of the electrostatic force. In order to maximise the facing surfaces without necessarily penalising the flexibility of the leg 5.11 at the level of its free end 5.12 it is possible to divide the end of the leg 5.11 as illustrated in FIG. 10B. The leg 5.11 terminates in several fingers 52, as it happens three. The circle materialises the surface of the fixed electrode 6.2 dedicated to the movable electrode 5.1. In FIG. 10A is represented the free end 5.13 of the leg 5.11 without ramification. It is assumed that in these figures the movable electrode 5.2 occupies the whole surface of the leg 5.11. In FIG. 10B, the intersection between the surfaces of the two fixed and movable electrodes 5.2, 6.2 is much greater than in FIG. 10A.

Another advantage on account of privileging the flexibility of the movable electrode 5.2 is to be able to reduce the spacing between the movable electrode 5.2 and the fixed electrode 6.2 in working position. In the extreme, there may be a physical contact between the movable electrode 5.2 and the fixed electrode 6.2 via a dielectric material 7, as has been seen in FIGS. 4C, 4D.

Each movable electrode 5.2 may cooperate with a fixed electrode 6.2 that is dedicated to it as is represented in FIGS. 10A, 10B. In an alternative, it is possible to provide for a single fixed electrode 6.2 which cooperates with all the movable electrodes 5.2, as illustrated in FIG. 3I.

The movable parts 5.1 of the electrostatic actuating means 5 may be controlled simultaneously in parallel or, quite the opposite, in a manner independent of each other. This latter embodiment is interesting especially in adaptive optics or for variable focal distance applications in which certain exterior effects, which may perturb the geometry of the dioptre, such as the effect of gravity for example, need to be compensated.

It may be that optical aberrations occur with an optical device having such a membrane 2. They are linked to the lack of parallelism between the edge of the deformed membrane 2 and the support 1 at the level of the anchoring. They can especially appear when the optical device of the invention is formed from two substrates assembled as will be described hereafter. They result in a maximum deflection which is no longer at the centre of the optical field 2.1. The optical axis of the optical device passes through the centre of the optical field 2.1. The quality of the images is deteriorated.

To limit such a phenomenon in conventional liquid lenses, it is aimed to optimise the assembly of the membrane 2 to the support 1, this assembly was based on sealing techniques so that at rest the requisite parallelism is obtained. But then when the lens is in operation, it may be necessary to vary its focal distance by means of a supply voltage V0 used to actuate the electrostatic actuating means 5. If the displacement induced by the electrostatic actuating means 5 is not uniform over the whole periphery of the membrane 2, the phenomenon appears and the quality of the image is degraded. The space d between the bottom 3.1 of the cup 3 and the fastening region 200 of the feet 5.12 of the movable parts 5.1 is not constant over the whole periphery of the membrane 2. This anomaly may also occur in an optical device according to the invention if nothing is done during the control of the electrostatic actuating means 5. Indeed, the different electrostatic actuators may not be supplied with exactly the same voltage V0. A drift off course of certain movable parts 5.1 may occur. The pressure of the liquid 4 may not be totally uniform over the whole periphery of the membrane 2, this may occur if the optical device is employed slightly inclined on one side. In operation, the phenomenon is thus difficult to control and strongly penalises this type of optical device. In order to combat this effect, it is possible to provide for a control of the command of the electrostatic actuating means 5.

Figure 11:
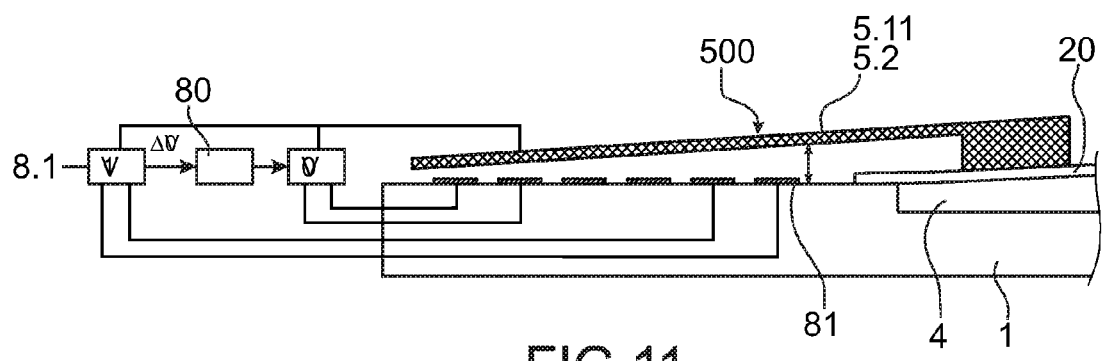
FIG. 11 shows an optical device according to the invention equipped with control means of the electrostatic actuating means.

Reference is made to FIG. 11. The variation of the focal distance of the optical device is always obtained by means of the action of the actuators 500 of the electrostatic actuating means when they are actuated, by application of a supply voltage V0 between movable electrode 5.2 and fixed electrode 6.2 aiming to generate a mechanical deformation of the legs 5.11.

In addition, control means 80 of the voltage V0 to apply to the actuators 500 as a function of the spacing between the movable electrode 5.2 and the support 1 are provided. The control means 80 cooperate with the capacitive measurement means 8.1 of the spacing between the movable electrode 5.2 and the support 1. The measurement means 8.1 may comprise several pairs of electrodes 5.2, 81 spread out between the support 1 and the leg 5.11 which is merged with the movable electrode. By applying a potential difference V1 to the two electrodes 5.2, 81 of each pair of electrodes and by measuring the capacitance on each pair of electrodes 5.2, 81, at the level of each of the pairs of electrodes 5.2, 81 the distance that separates them is acquired. One of the electrodes is merged with the movable electrode of an electrostatic actuator 500 and the electrode is arranged on the support 1.

In FIG. 11, the control means 80 have only been shown schematically, they are only shown for one pair of electrodes 5.2, 81 and one actuator 500. The electrode 81 situated on the support 1 of one pair of capacitive measurement electrodes may be an additional electrode only serving for the measurement or may be a fixed electrode of the electrostatic actuating means. The same remark applies for the movable electrode borne by the leg, it could be an additional electrode. In the case where the electrodes of the pair are not dedicated uniquely to the capacitive measurement, they can be used alternatively for the actuation and for the measurement. It is possible to arrange on the support 1 several fixed electrodes 6.2 spread out in a concentric manner as illustrated in FIG. 11. In an alternative, the measurement means could be situated between the bottom of the cup and the film of the membrane.

During the operation of the optical device object of the invention, one or more capacitive measurements are carried out at the level of at least one actuator 500, the control means 80 receive the capacitive measurements of the measurement means 8.1, compare them to a reference value and if the results of the comparison are not those expected command that an additional correction voltage $\Delta V0$, in addition to the reference voltage $V0$, is applied to the corresponding actuator 500, at the places where the capacitive measurement differs from the reference value.

Figure 12A:
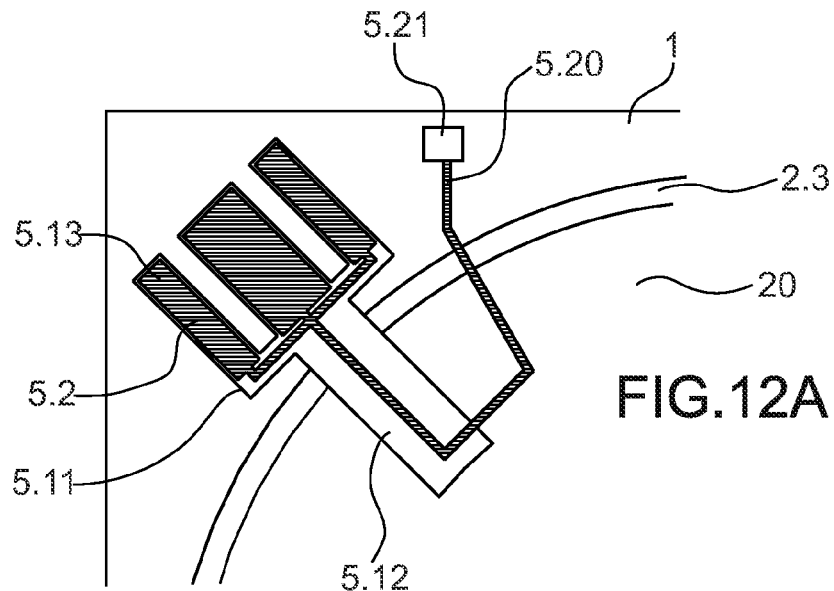
FIGS. 12A to 12F illustrate different characteristics of the movable part and the movable electrode of a membrane of an optical device according to the invention and its energy supply.

Details on the movable part 5.1 of the electrostatic actuators 500 will now be added and reference made to FIGS. 12A to 12F. FIG. 12A shows a top view of the movable part 5.1 with the leg 5.11, the free end 5.13 of which is divided. The leg 5.11 is connected to the foot 5.12 which is fastened to the film 20 of the membrane 2. The foot 5.12 corresponds substantially to the part included in the dotted line circle. In this example, the leg 5.11 and the foot 5.12 are made of a dielectric material. The hatched part represents the movable electrode 5.2 which is overlying the leg 5.11 and which extends by a segment of conductive path 5.20 up to a contact pad 5.21 for the energy supply situated on the support 1.

It is obviously possible that the leg 5.11 and/or the foot 5.12 is made of a conductive material. In this case, the leg 5.11 forms the movable electrode and the foot 5.12 contributes to forming the electrical connection to the contact pad 5.21. It may be that the conductive path 5.20 which runs from the movable electrode 5.2 to the contact pad 5.21 is made of the same material as the movable electrode 5.2 as illustrated in FIG. 12A or of a different material if the leg 5.11 and the foot 5.12 are one conductor and the other dielectric for example.

To resume, the movable part of the electrostatic actuating means may be formed from organic materials chosen from polydimethylsiloxane (PDMS), polymethyl methacrylate (PMMA) polyethylene terephthalate (PET), polycarbonate (PC), parylene, epoxy resins, inorganic materials chosen from silicon dioxide, silicon nitride, germanium, metallic materials chosen from titanium, titanium nitride, aluminium, indium tin oxide (ITO), gold, chromium.

Figure 12B:
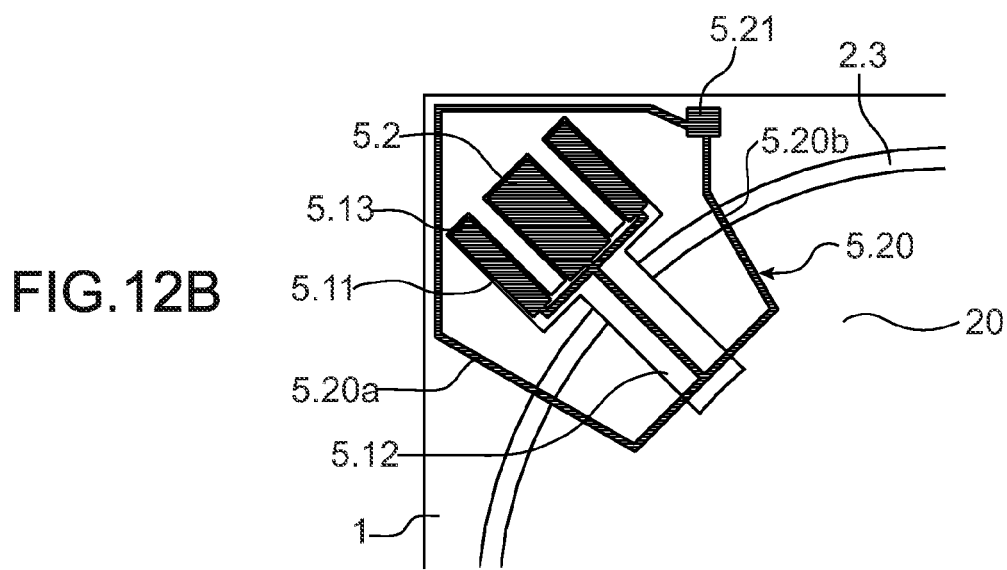

In FIG. 12A, the conductive path 5.20 runs on the film 20 of the membrane 2, and reaches the support 1 beyond the membrane 2. In order to render symmetrical the mechanical effect of the conductive path 5.20 on the film 20 of the membrane 2 and on the foot 5.12, it is possible to divide the conductive path 5.20 into two strands 5.20a, 5.20b so as to make it symmetrical in relation to the current segment on the foot 5.12. In FIG. 12B, the two strands 5.20a, 5.20b of the conductive path 5.20 meet up again at the level of the contact pad 5.21 and form a closed loop. The contact pick-up between the conductive path 5.20 and the movable electrode 5.2 can take place directly as illustrated in FIGS. 12A, 12B. This could also be the case if the leg 5.11 was conductive. On the other hand, if the movable electrode 5.2 is underlying the leg 5.11 or is inserted between two dielectric layers 7 of the leg 5.11 as illustrated in FIG. 4C, the contact pick-up between the conductive path 5.20 and the movable electrode 5.2 takes place by means of the metallised hole 60.

In so far as the legs 5.11 share a single foot 5.12 continuous in crown shape, as illustrated in FIG. 3B, it is possible to use at least one sacrificed leg 511 dedicated to the movable electrical supply electrodes 5.2. This sacrificed leg 511 has one end which instead of being free is mechanically fixed to the support 1, in the example by means of a wedge 512. The sacrificed leg 511 is electrically connected to an energy source U. This sacrificed leg 511 makes it possible to supply the movable electrodes 5.2 by means of the single foot 5.12.

In this case, the sacrificed leg 511 does not participate in the actuation and, in this sense does not exert any force on the film 20 of the membrane 2. To keep a symmetry of deformation, it is possible to sacrifice several legs and to dedicate them to the electrical supply. Other solutions are possible for the energy supply.

It is possible to use the foot to bring back a contact pick-up at the level of the support and provide for an operation of soldering a supply wire onto the support in a zone far from the membrane.

Figure 12C:
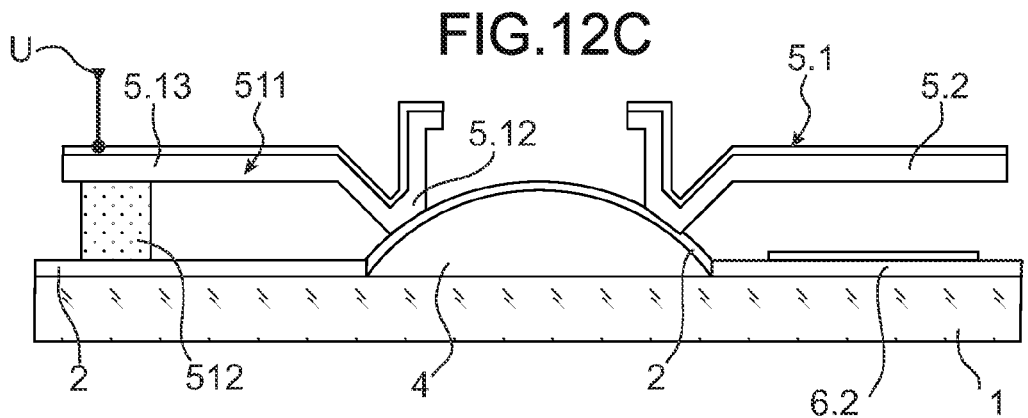
Figure 12D:
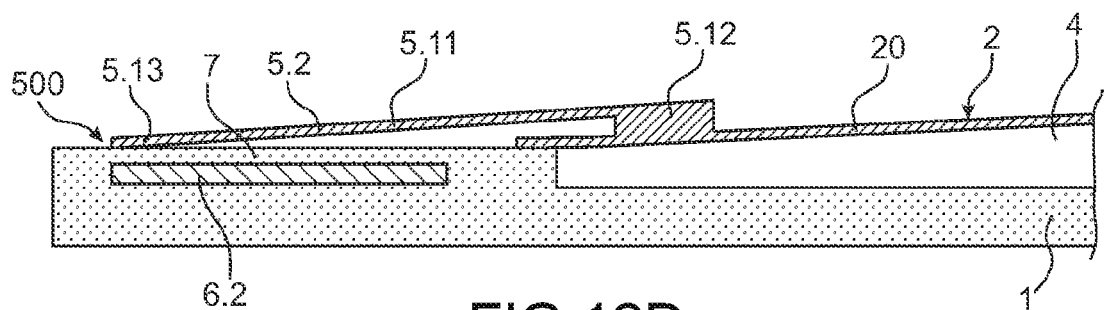
Figure 12E:
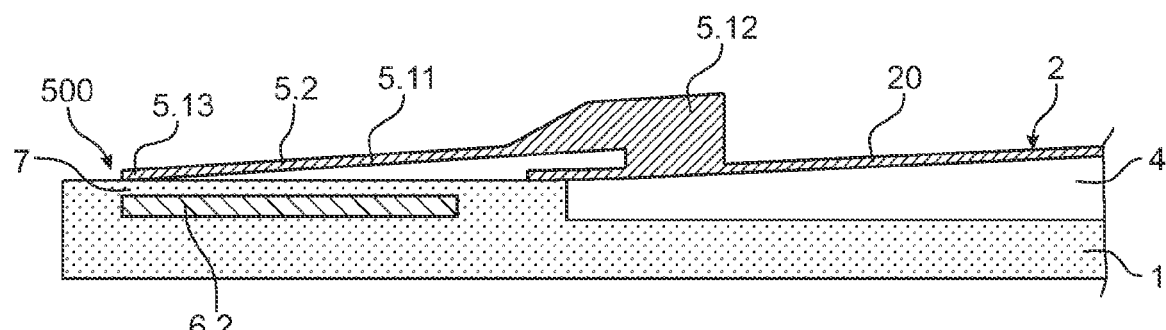

In FIG. 12C, only the left leg 511 is sacrificed, that on the right is operational. The geometry, the rigidity and the position of the sacrificed legs 511 must be optimised to limit the impact of these sacrificed legs 511 on the deformation of the film 20 of the membrane 2. The foot 5.12 of the movable part 5.2 fastened to the film 20 of the membrane 2 makes it possible to transmit the stress generated by the electrostatic actuation on the membrane 2 to displace the liquid 4. In order to optimise the transfer of stresses and displacement, the structure of the foot 5.12 may be determined by simulation by means of mechanical simulation software such as ANSYS for example. Generally, it is sought to increase the rigidity of the foot 5.12 as illustrated in FIG. 12E. In FIG. 12D, the foot 5.12 is less massive, less thick, less rigid than in FIG. 12E.

Figure 12F:
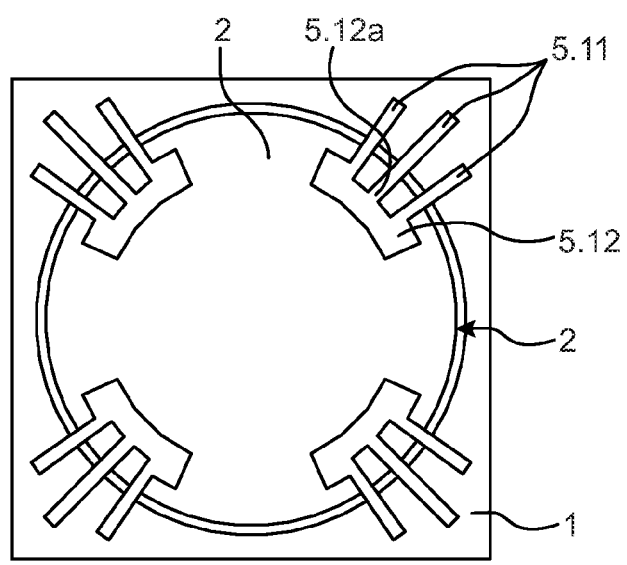

In FIG. 12F is represented a foot 5.12 which comprises a divided portion 5.12a, each of the ramifications continues in a leg 5.11. The foot 5.12 is common to several legs 5.11.

Concerning the material of the foot 5.12, it may be the same as that of the leg 5.11 or be different. Materials that are suitable for these two parts, foot 5.12 and leg 5.11, have already been enumerated above, namely conductive metallic materials such as titanium nitride, gold, a chromium/gold stack, aluminium, in this case they constitute the movable electrode 5.2. If the movable electrode 5.2 is borne by the leg 5.11 and if a conductive path 5.20 runs on the foot 5.12, they may be made of a dielectric material such as silicon nitride or silicon dioxide for example. The thickness of the foot 5.12 may be between around several nanometres and several tens of micrometres.

The number of electrostatic actuators 500 and thus the number of movable parts 5.1 anchored on the film 20 of the membrane 2 may be any number.

Figure 13A:
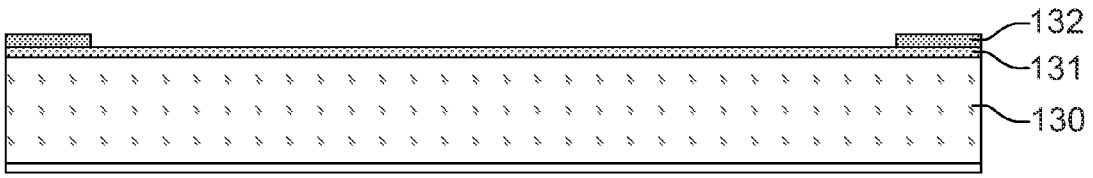
FIGS. 13A to 13O illustrate different steps of forming an optical device according to the invention in which the movable part of the electrostatic actuating means is in contact with the liquid.
Figure 13B:
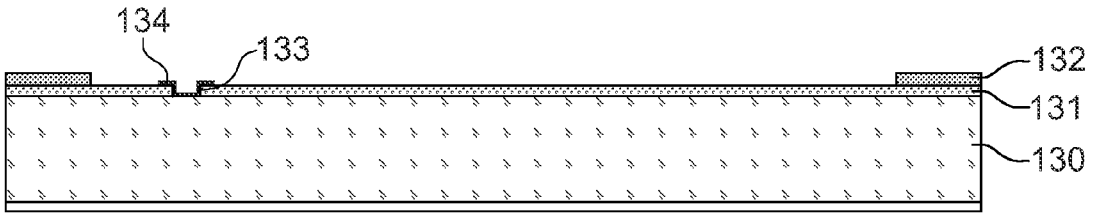

An example of method of producing an optical device with deformable membrane will now be described, while referring to FIGS. 13A to 13O, in which the movable part of the electrostatic actuating means is situated in contact with the liquid. In FIG. 13A, one starts from an initial semi-conductor substrate 130 made of silicon for example. A dielectric layer 131 is formed on the surface, for example made of thermal oxide. It is provided that this initial substrate 130 will be bonded to a protection device which may take the form of a second substrate and optionally the bonding zone may be prepared by depositing a material 132 having good adhesion properties vis-à-vis the chosen bonding technology. The adhesive will be put in place later after the creation of the fixed electrodes In FIG. 13B, by an operation of etching after lithography, at least one opening 133 is made in the dielectric layer 131 that has to accommodate a contact pad 134 for the movable electrodes to come. The contact pad 134 is formed in the opening 133 for example by physical vapour deposition (PVD) of a metallic layer and etching after lithography. The deposition may be a titanium/nickel/gold stack for example.

Figure 13C:
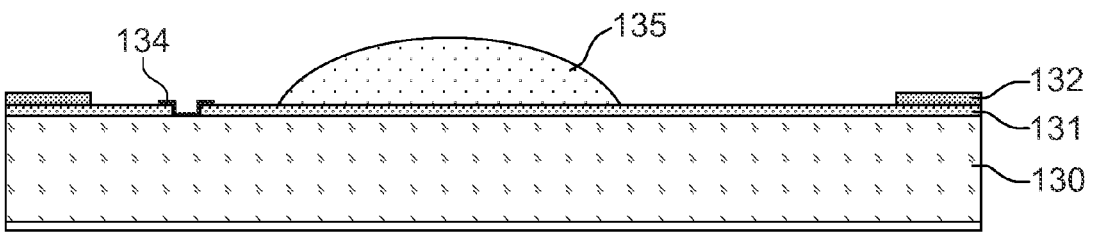

In FIG. 13C, a sacrificial layer is formed and it is made to take an appropriate shape, for example cambered, so that it can serve as first sacrificial mould 135 as that serving for the film 20 of the membrane 2. The sacrificial layer may be made of photosensitive polymer. The shaping of the first sacrificial mould 135 may be carried out by lithography and hot flow.

Figure 13D:
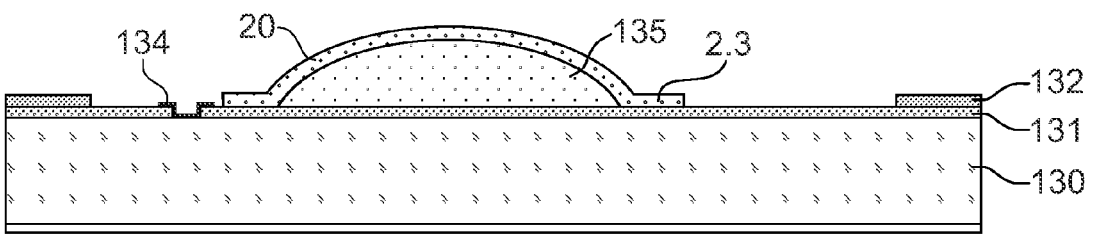

In FIG. 13D, the film 20 of the membrane 2 is deposited on the first sacrificial mould 135 and it is delimited so that it covers the first sacrificial mould 135 and overflows all around on the covered substrate. What overflows corresponds to the anchoring zone 2.3. The delimitation may be carried out by etching after lithography. The film 20 may be made of silicon nitride and it may be deposited by PECVD (plasma enhanced chemical vapour deposition).

Figure 13E:
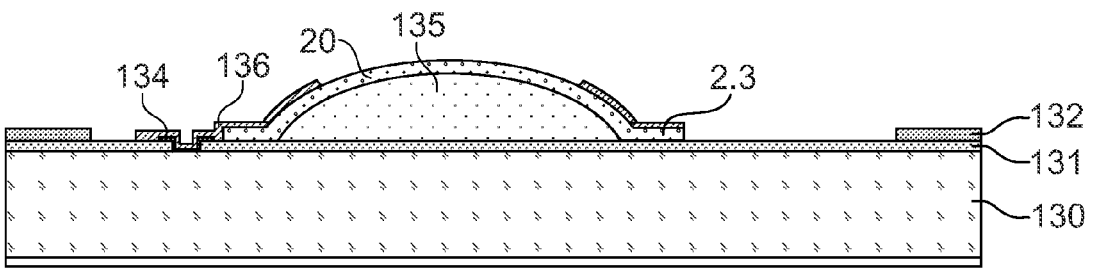

In FIG. 13E, at least one conductive path 136 is formed that has to lead to one or more movable electrodes. It surmounts the contact pad 134 and runs on the film 20 of the membrane on its anchoring zone 2.3 and its intermediate zone at the level of fixation regions. To form it, two metallic layers of chromium/gold type may be deposited by PVD for example and they may be delimited by etching after lithography.

Figure 13F:
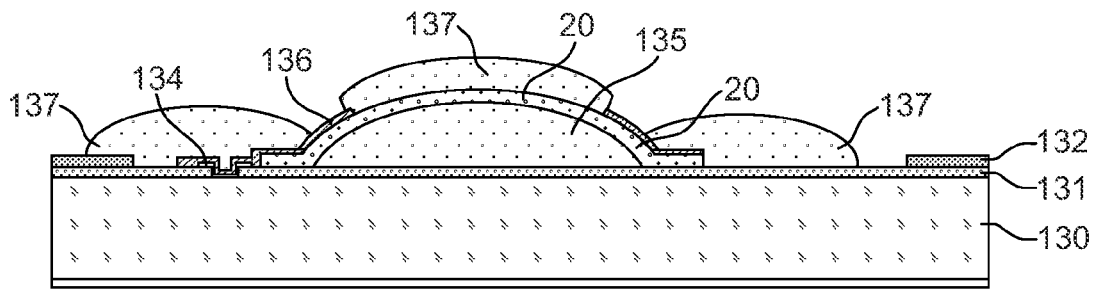

A sacrificial layer is deposited, which is then shaped. It has to serve as second sacrificial mould 137 to the movable part of each electrostatic actuator. This second sacrificial mould 137 may be made in the manner of that serving for the film 20 of the membrane 2. The sacrificial layer may be made of photosensitive polymer. The shaping may be carried out by lithography and hot flow. The second sacrificial mould 137 may optionally cover the film of the membrane 2 in its central zone 2.1 particularly to protect it but it leaves bare locally the path 136 created previously in its part at the level of the intermediate zone to accommodate the foot of the movable part. Reference is made to FIG. 13F.

Figure 13G:
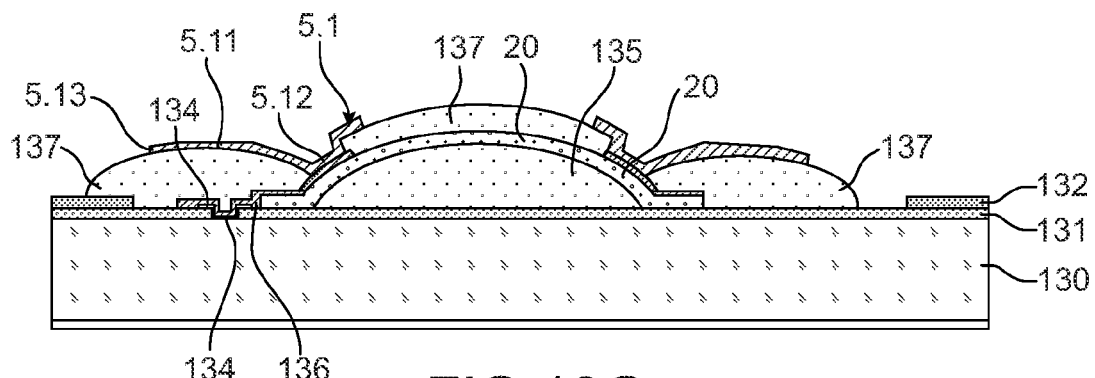
Figure 13H:
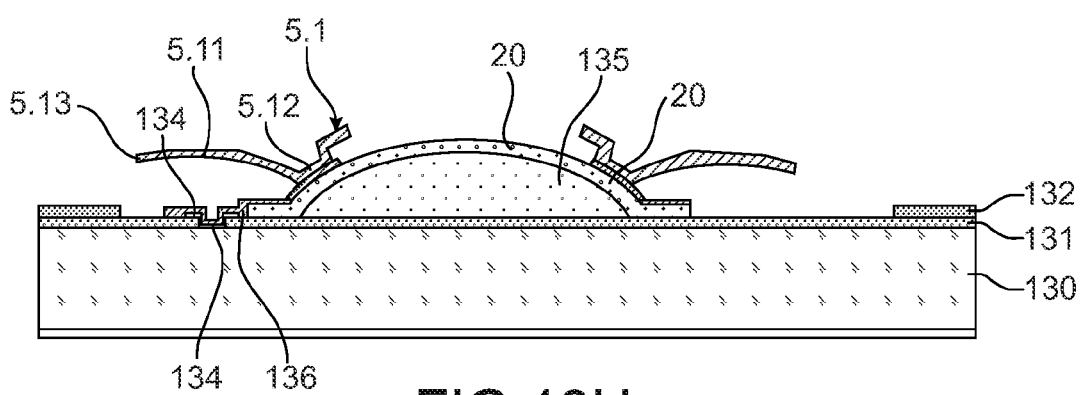

The movable part 5.1 of each electrostatic actuator is then formed with its foot 5.12 fastened to the film 20 of the membrane 2 surmounting the path 136 created previously and with its leg 5.11 having a free end 5.13 and the other connected to the foot 5.12 (FIG. 13G). The movable part 5.1 is then freed by eliminating the second sacrificial mould 137 by oxygen plasma and if necessary by carrying out a cleaning operation (FIG. 13H).

Figure 13I:
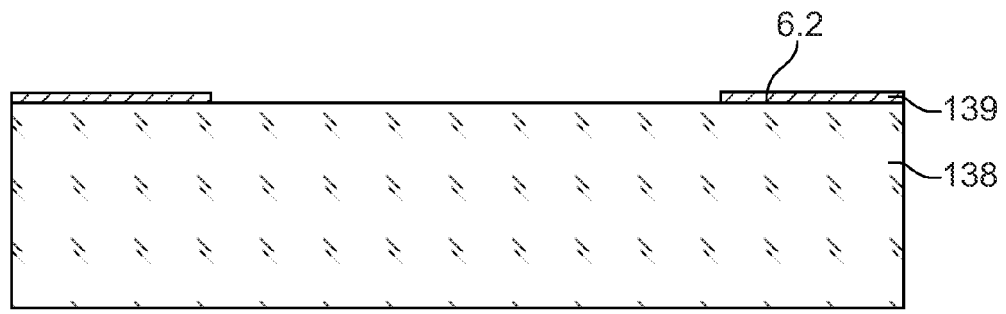

On a second substrate 138 transparent to light with which the optical device has to operate, for example of glass, a metallic layer is going to be deposited intended to form at least one fixed electrode 6.2 of each electrostatic actuator connected to at least one appropriate contact pad 139. The contour of each electrode 6.2 and the contact pad 139 are then delimited by etching after lithography. This fixed electrode 6.2 may be formed for example with a chromium/gold stack. Reference is made to FIG. 13I.

Figure 13J:
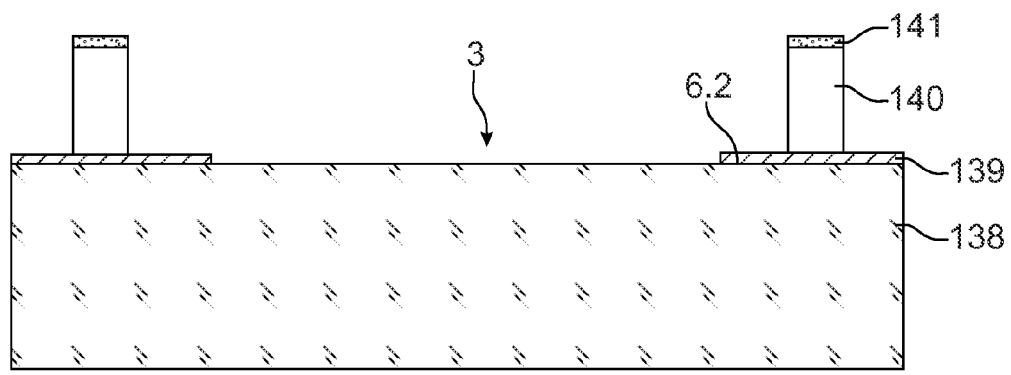

In FIG. 13J, above the fixed electrode 6.2 the lateral walls 140 are going to be built of the cup 3 that has to accommodate the liquid entrapped by the membrane. The contact pad 139 is left outside the cup 3. The lateral walls 140 of the cup 3 may be formed by deposition of a layer of silicon dioxide for example by PECVD then etching after lithography. The summit of the walls 140 may be optionally treated for the purpose of bonding for example by depositing on it a material having good adhesion properties vis-à-vis the chosen bonding technology. The adhesive 141 is then deposited.

Figure 13K:
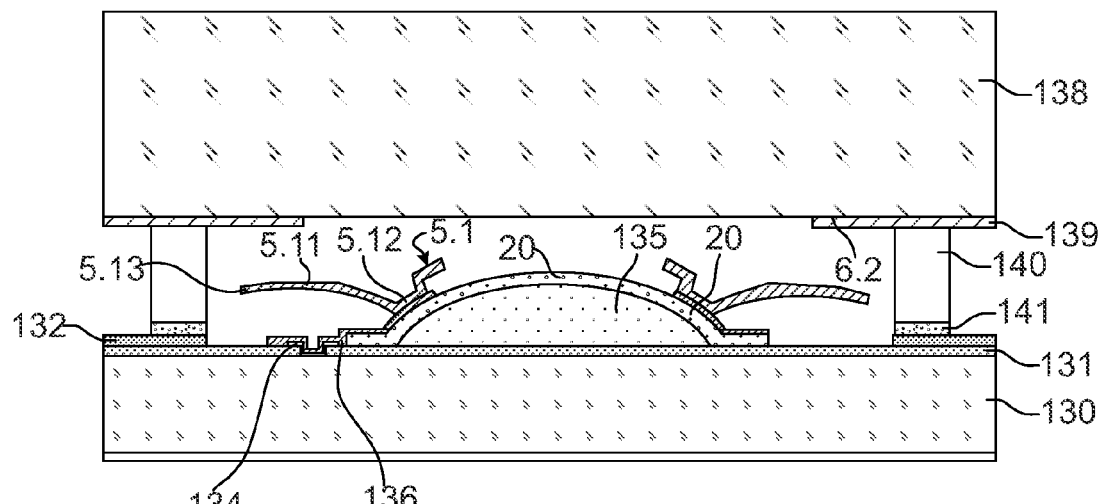

The following step illustrated in FIG. 13K consists in assembling the two substrates 138 and 130 so that the movable part 5.1 of the actuators is situated in the cup 3. The second substrate 138 serves as protection.

Figure 13L:
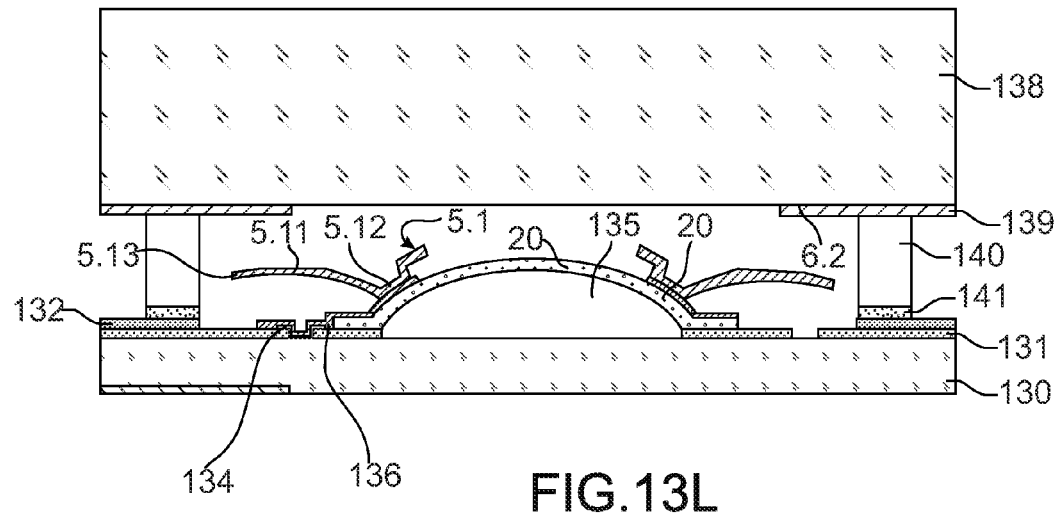

It is possible to thin the initial substrate 130 by grinding of its rear face, this step being illustrated in FIG. 13L. It is also possible to provide at this stage for the deposition of at least one contact pad 142 outside the cavity 3 which must be connected by a metallised hole to the contact pad 134 formed on the other face of the initial substrate 130 and thus to the inside of the cavity 3.

Figure 13M:
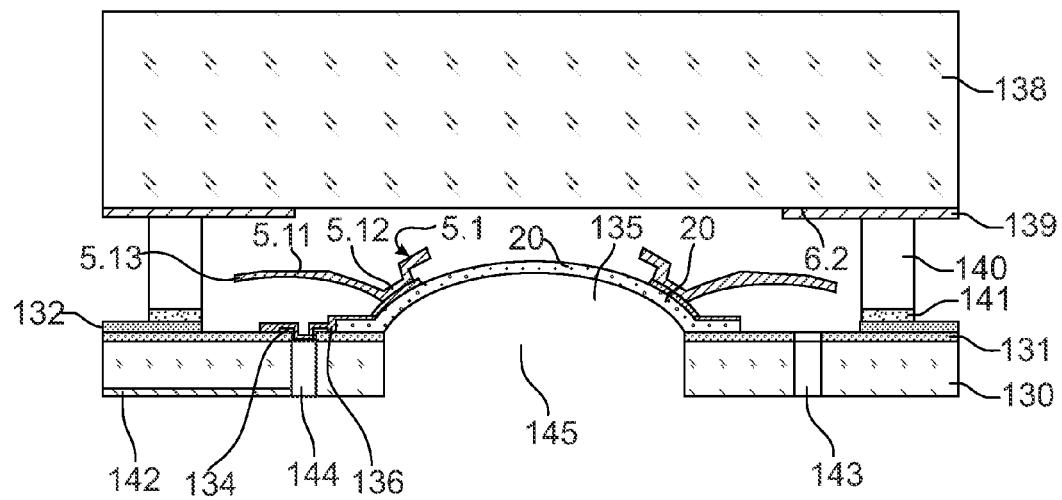

In FIG. 13M, by an operation of etching after lithography, is going to be formed at least one through hole 143 in the initial substrate 130 opening out into the cavity 3 for its filling, a hole 144 opening out at the level of the contact pad 134 and a larger through hole 145 at the level of the membrane 2 delimiting in the initial substrate 130 a frame on which is anchored the film 20. Thanks to this access 145, it is possible to free the membrane 2 by eliminating the sacrificial material of the first sacrificial mould 135. In an alternative, it could be envisaged to form an access through the film of the membrane to eliminate the first sacrificial mould 135. The etching may be a reactive ion etching RIE. The hole 146 in the initial substrate serving to eliminate the first sacrificial mould 135 will preferably have at least the size of the central zone of the film. The elimination may be carried out with an oxygen plasma.

Figure 13N:
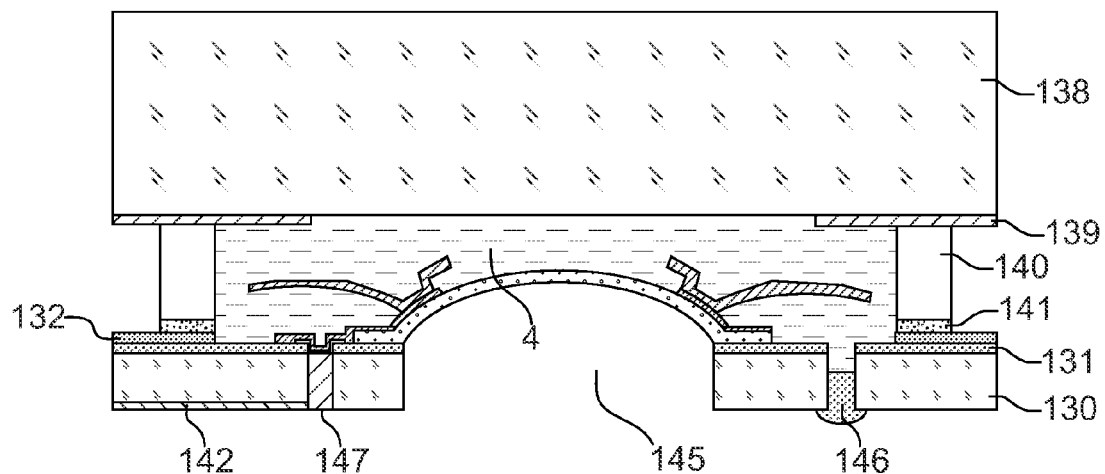

In FIG. 13N, the cavity 3 is filled with liquid 4, the hole 143 for accessing the cavity 3 is blocked with a plug 146 made of organic adhesive or metal alloy and the through hole 144 is filled with a metallic material for example a chromium/gold stack, so as to ensure an electrical continuity between the contact pad 134 inside the cavity and the contact pad 142 outside the cavity. A metallised hole referenced 147 in FIG. 13N is then obtained. If the silicon is a silicon with low resistivity, for example of the order of 10 micro ohms per centimetre, it is no longer necessary to provide for a metallised hole, the substrate itself ensures an electrical continuity between the internal contact pad 134 and the external contact pad 142. The movable electrodes 5.2 are then all at the same potential. The use of metallised holes makes it possible to differentiate the potentials of the movable electrodes.

Figure 13O:
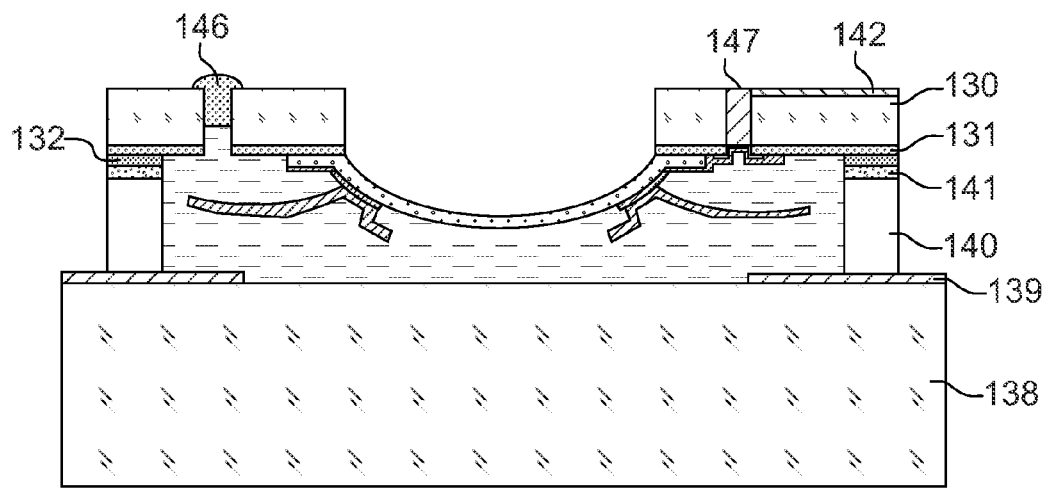

Since such a method makes it possible to form in a collective manner several optical devices on the substrates, in FIG. 13O, separately, the initial substrate 130 and the second substrate 138 are cut so as to individualise the different optical devices. Saws S have been shown schematically to make the cuts. The saw lines separate electrically the contact pads 139, 142 whether they are connected to the fixed electrodes or to the movable electrodes. The cutting is carried out in two stages because once cut the second substrate 138 is larger than the initial substrate 130. This size difference makes it possible to easily access the contact pad 139.

An example of method of an optical device according to the invention will now be described while referring to FIGS. 14A to 14M in which the movable part of the actuating means of the membrane is located opposite the liquid when the optical device is assembled.

One starts with an initial substrate 150 made of silicon for example, one principal face of which is covered with a dielectric layer 151, silicon dioxide for example. In this example, the initial substrate 150 is flat but it would be possible to use a substrate provided with a cup, etched for example by dry method of reactive ion etching (RIE) type or by wet method by means of potassium hydroxide KOH for a substrate made of silicon. After the creation of the cup, the substrate thereby structured may be covered with thermal oxide for example.

Figure 14A:
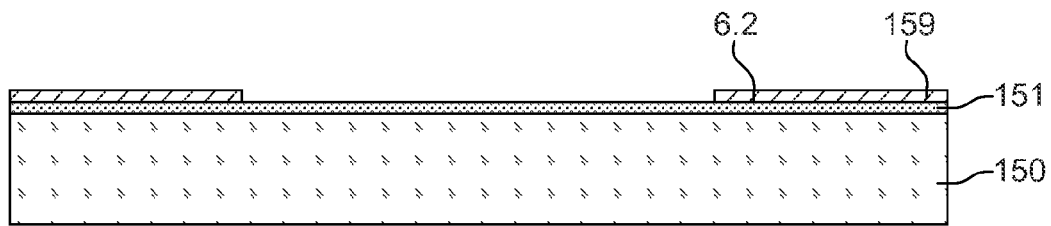
FIGS. 14A to 14M illustrate different steps of forming an optical device according to the invention in which the movable part of the electrostatic actuating means is without contact with the liquid.

In FIG. 14A, a metallic layer is deposited on the dielectric layer 151, for example in a stack of chromium/gold sub-layers that is delimited by etching after lithography to form at least one fixed electrode 6.2 terminating in a contact pad 159.

Figure 14B:
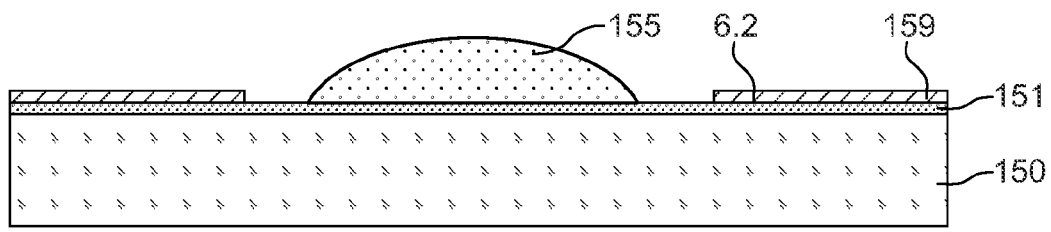

In FIG. 14B, a sacrificial layer is formed and it is made to take an appropriate shape, for example cambered, so that it can serve as first sacrificial mould 155 for the film 20 of the membrane 2. The sacrificial layer may be made of photosensitive polymer. The shaping of the first sacrificial mould 155 may be carried out by lithography and hot flow.

Figure 14C:
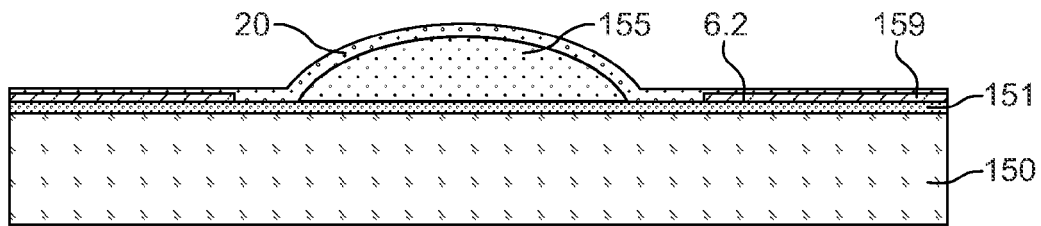

In FIG. 14C, the film 20 of the membrane 2 is deposited on the first sacrificial mould 155 and it is delimited so that it covers the first sacrificial mould 155 and overflows all around up to the fixed electrode 6.2 and to the contact pad 159. That which overflows corresponds to the anchoring zone 2.3. The delimitation may be carried out by etching after lithography. The film 20 may be made of silicon nitride and it may be deposited by PECVD (plasma enhanced chemical vapour deposition).

Figure 14D:
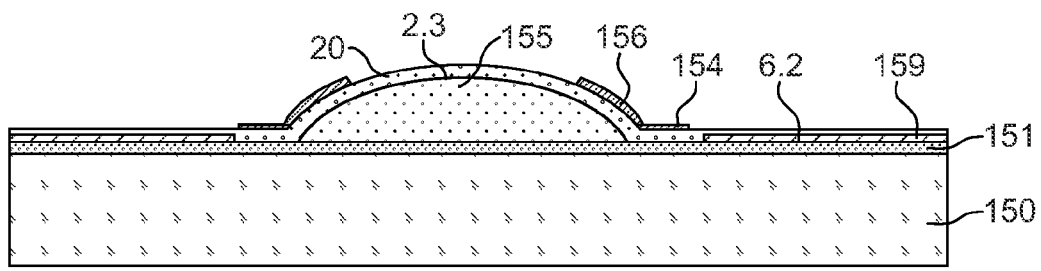

In FIG. 14D, at least one conductive path 156 is formed that has to lead to at least one movable electrode to come. It runs on the membrane 2 on its anchoring zone 2.3 and its intermediate zone 2.2 at the level of fixation regions. It stops before surmounting the fixed electrode 6.2 by a contact pad 154. To form them, it is possible to deposit a metallic layer by PVD of a chromium/gold stack, for example and delimiting it by etching after lithography.

Figure 14E:
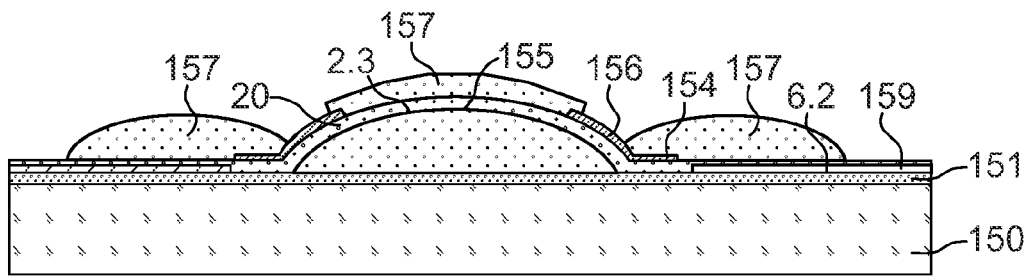

A sacrificial layer is deposited, that is then shaped, that has to serve as second sacrificial mould 157 for the movable part of each electrostatic actuator. This second sacrificial mould 157 may be made in the manner of that serving for the membrane 2. The sacrificial layer may be made of photosensitive polymer. The shaping may be carried out by lithography and hot flow. The sacrificial layer may optionally cover the membrane 2 in its central zone 2.1 especially to protect it but it leaves bare locally the conductive path 156 created previously in its part at the level of the intermediate zone 2.2 to accommodate the foot of the movable part. Reference is made to FIG. 14E.

Figure 14F:
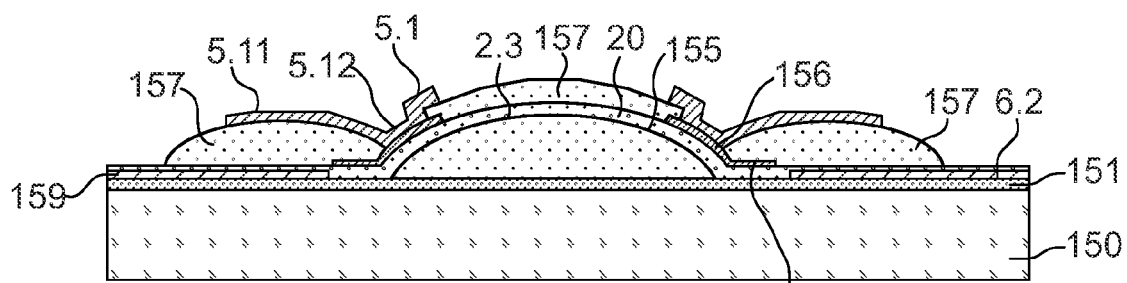
Figure 14G:
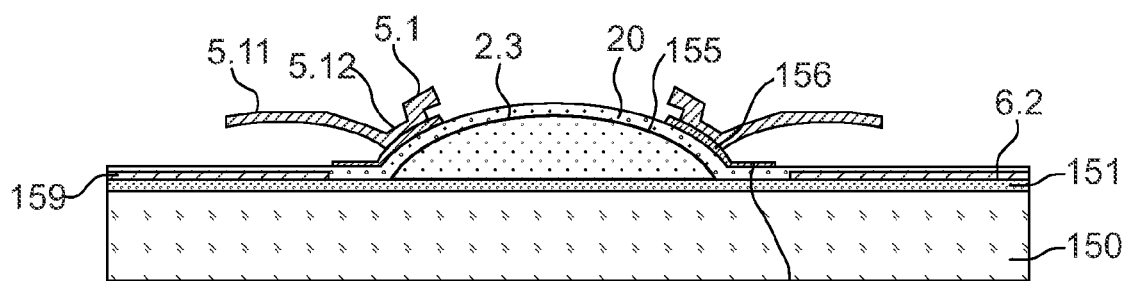
Figure 14H:
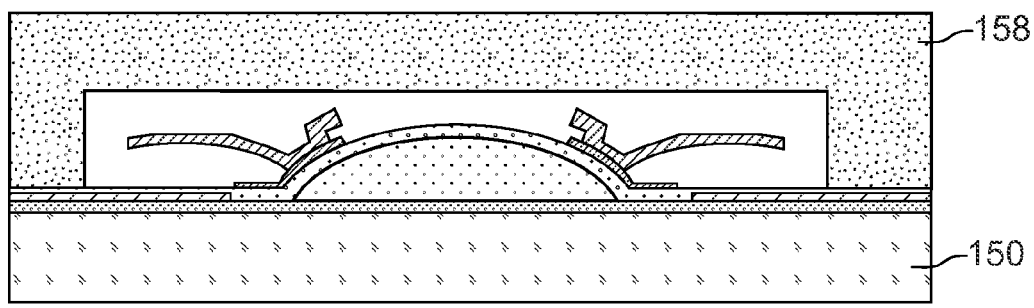

The movable part 5.1 of each electrostatic actuator is then formed with its foot 5.12 fastened to the film 20 of the membrane 2 surmounting the path 156 created previously in its part at the level of the intermediate zone 2.2, its leg 5.11 having one free end 5.13 and the other connected to the foot 5.12 (FIG. 14F). This may be done for example by depositing a layer of a chromium/gold stack on the second sacrificial mould 157 and on the conductive path 156 at the place where it is bare for the fixation of the foot 5.12. The movable part 5.1 is then freed by eliminating the second sacrificial mould 157 by oxygen plasma and if necessary by carrying out a cleaning operation (FIG. 14G).

The membrane 2 thereby formed may be covered with a protection device 158 such as a transparent glass cap for example (FIG. 14H) by bonding.

Figure 14I:
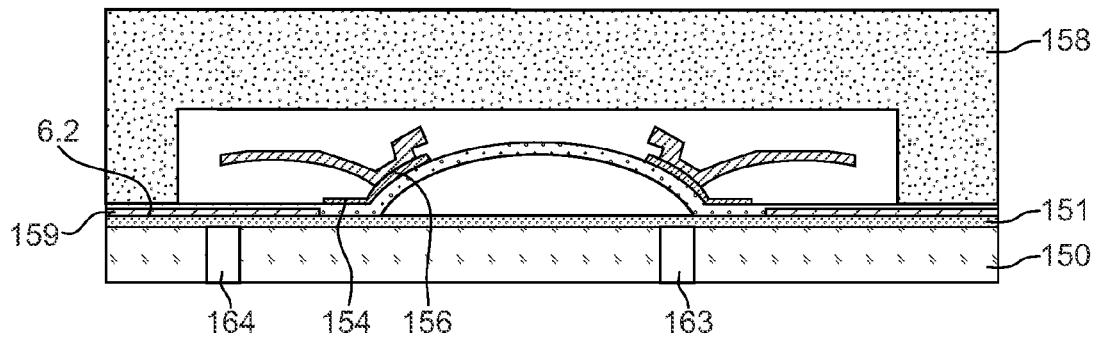

It is possible to thin the initial substrate 150 by grinding its rear face, this step being illustrated in FIG. 14I.

In FIG. 14I, by an operation of etching after lithography, at least one through hole 163 is going to be formed in the initial substrate 150 opening out under the membrane 2 at the level of the first sacrificial mould 155 for the elimination of the first sacrificial mould 155 and the filling of the liquid, a hole opening out 164 at the level of the contact pad 159 connected to the fixed electrode 6.2 and a hole opening out at the level of the contact pad 154 connected to the conductive path 156 that has to supply with energy the movable part 5.1. The etching may be reactive ion etching (RIE) for example. In FIG. 14I and following figures, only the hole 164 connected to the fixed electrode 6.2 is represented. The other is not visible because situated outside of the sectional plane of the figures.

Figure 14J:
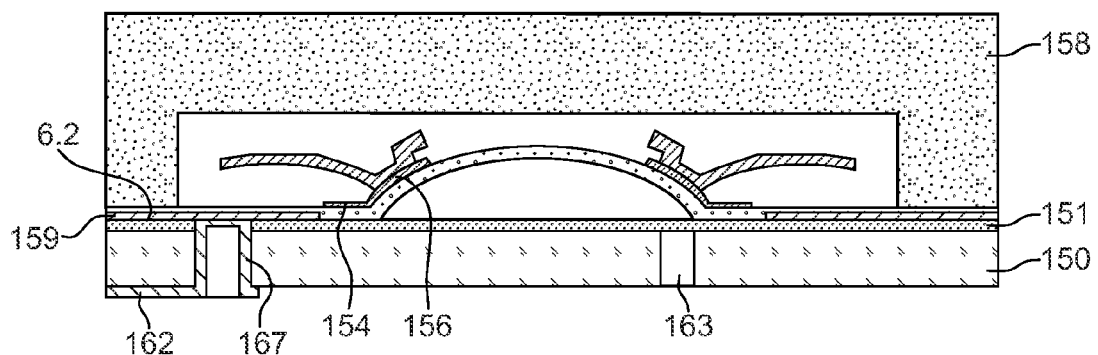

The holes 164 opening out at the level of the contact pads are then metallised in FIG. 14J. For the same reasons as those indicated above, only a single metallised hole is shown and it bears the reference 167. At least one external contact pad 162 is also formed in electrical continuity with each of the metallised holes 167.

Figure 14K:
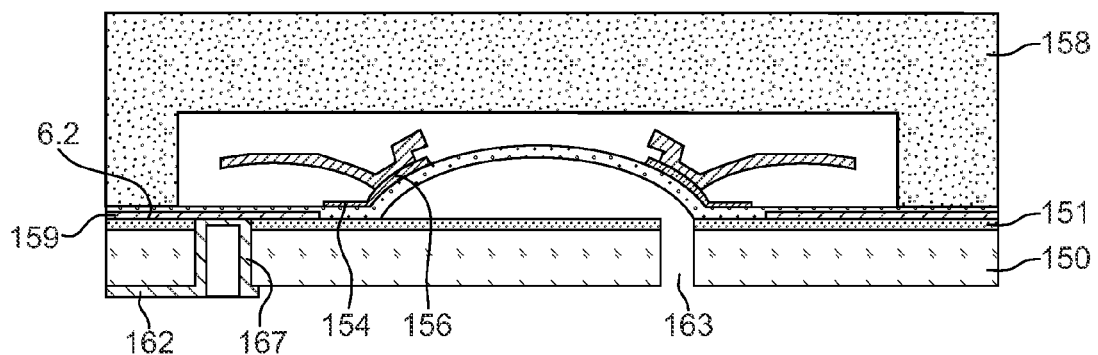

In FIG. 14K, the first sacrificial mould 155 is eliminated via the hole 163 that has just been etched and a cavity 3 is thereby formed under the film 20 of the membrane 2.

Figure 14L:
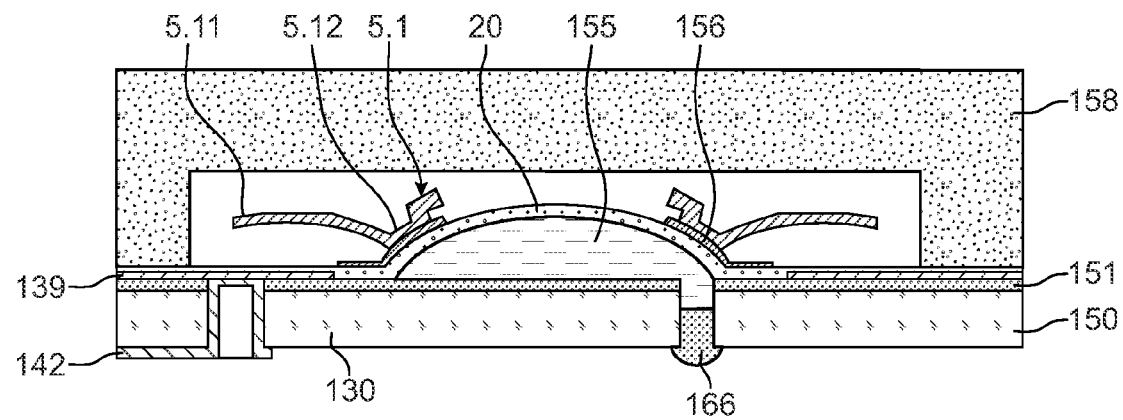

In FIG. 14L, the cavity 3 is filled with liquid 4 via the hole 163 and it is blocked by means of a plug 166.

Figure 14M:
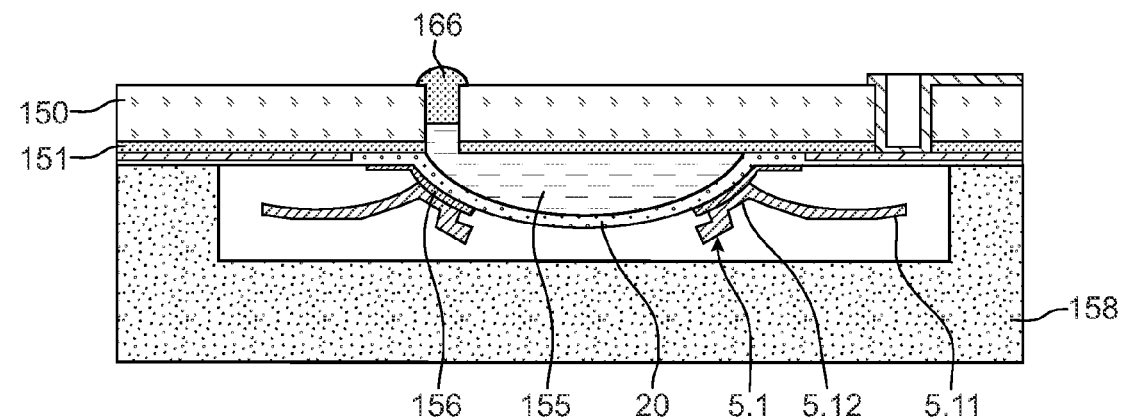
Figure 15A:
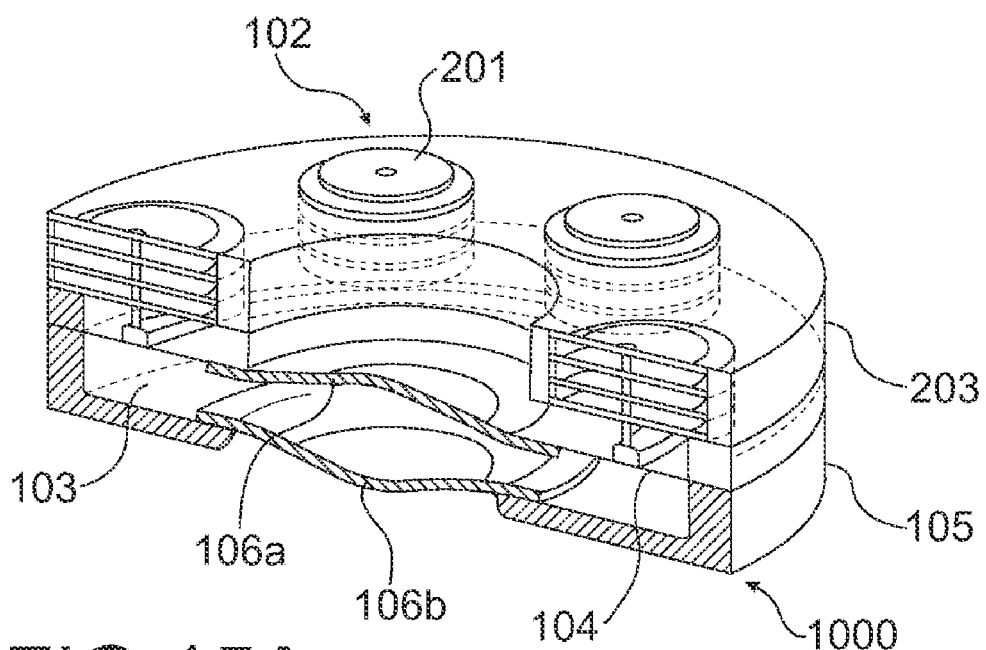
FIGS. 15A, 15B already described, show liquid lenses of the prior art.
Figure 15B:
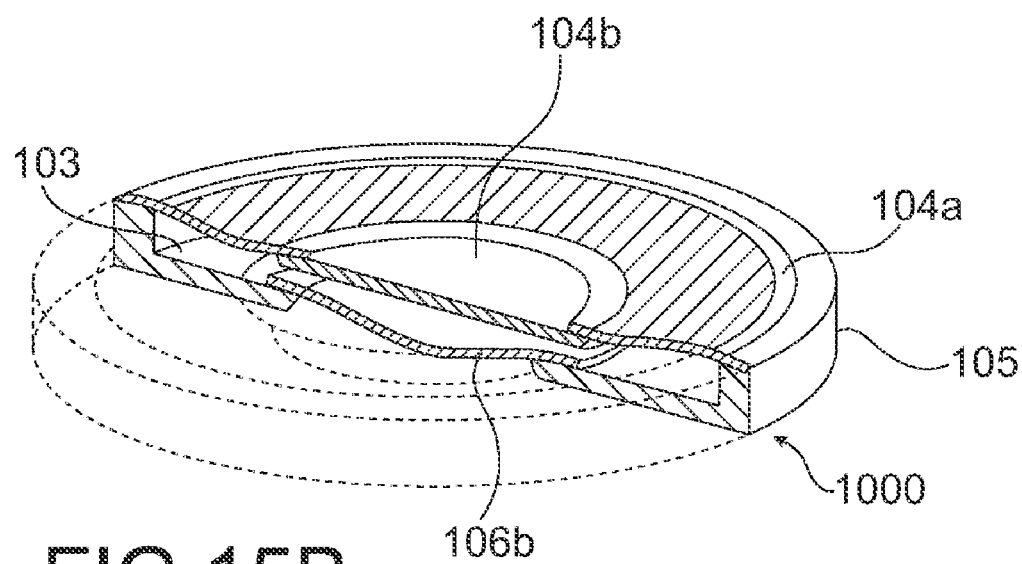

It is assumed that several optical devices have been formed in a collective manner on the initial substrate 150. In FIG. 14M, the substrate 150 is cut so as to individualise the different optical devices. It is assumed that the caps 158 are those already individualised.

In the examples that have just been described, it has been assumed that the sacrificial layers are made of photosensitive polymer.

It is obviously possible to use other materials such as silicon dioxide deposited by PECVD, the freeing taking place by chemical attack by means of hydrofluoric acid in vapour or liquid phase. Another example would be to use polycrystalline silicon deposited by PVD. The freeing could then be carried out with a gaseous mixture of xenon difluoride. Yet another example would be to use tungsten deposited by PVD. The freeing could be carried out by wet chemical attack.

As regards the bonding of the initial substrate and the protection device, numerous techniques may be employed especially those employed in the MEMS (micro-electro-mechanical systems) field such as organic bonding, anodic bonding, gold/silicon or gold/tin eutectic bonding.

The walls 140 of the cup 3 may be made from material other than silicon dioxide. It is possible for example to use a negative photosensitive polymer of BCB (benzocyclobutene) type, delimited by lithography.

Depending on the bonding technique, the method to form the cup 3, the first sacrificial mould for the film 20 or the movable parts may be different. The examples presented are not limitative.

Although several embodiments of the present invention have been described in a detailed manner, it will be understood that different changes and modifications may be made without going beyond the scope of the invention and especially other methods may be used to form the membrane and the electrostatic actuating means.

The invention claimed is:

1. Optical device comprising a membrane deformable in a reversible manner comprising a flexible film having at least one peripheral anchoring zone, a central zone, an intermediate zone between the central zone and the peripheral anchoring zone, the membrane being anchored at the level of its anchoring zone on a support and electrostatic actuating means with one or more fixed electrodes borne by the support and one or more movable parts, characterised in that the support and the membrane contribute to trapping a constant volume of liquid in contact with one of the faces of the film, the movable parts of the actuating means each being formed of a leg terminating on one side in a foot mechanically fastened to a film-fastening region located in the intermediate zone and terminating on the other side in a free end, the leg incorporating a movable electrode at least on the side of its free end, the actuation of the electrostatic actuating means from a rest position to a working position having the effect of attracting the movable electrode towards the fixed electrode which is placed facing and displacing the liquid located at the level of the fastening region towards the central zone so as to adjust the radius of curvature of the membrane.

2. Optical device according to claim 1, wherein the free end of the leg is located either opposite the central zone in relation to the foot, or on the side of the central zone opposite the peripheral anchoring zone in relation to the foot.

3. Optical device according to claim 1, wherein the film comprises at least one continuous layer which extends over its whole surface.

4. Optical device according to claim 1, wherein the foot is fixed to the film or forms an integral part of the film.

5. Optical device according to claim 1, wherein the leg is divided on the side of its free end.

6. Optical device according to claim 1, wherein the foot has ramifications, a leg stemming from each ramification.

7. Optical device according to claim 1, wherein a foot cooperates with several legs.

8. Optical device according to claim 1, wherein the movable parts share a single foot.

9. Optical device according to claim 1, wherein the leg is merged with the movable electrode.

10. Optical device according to claim 1, wherein the movable electrode is one of the constituents of the leg.

11. Optical device according to claim 1, wherein the membrane further comprises a conductive path connected to the movable electrode which runs on the film.

12. Optical device according to claim 11, wherein the conductive path is divided on the film into two strands substantially symmetrical in relation to the leg.

13. Optical device according to claim 1, wherein the film comprises at the level of the intermediate zone a reinforced region at the level of which the foot is fastened to the film.

14. Optical device according to claim 1, wherein the film comprises a zone with increased flexibility between the anchoring zone and the intermediate zone.

15. Optical device according to claim 1, wherein the film comprises a reinforcement zone between the central zone and the intermediate zone.

16. Optical device according to claim 1, wherein the leg comprises several segments placed end to end, extending in different directions.

17. Optical device according to claim 1, wherein the foot is fixed by means of a mechanical fixation device to the film.

18. Optical device according to claim 1, wherein the free end extends beyond the edge of the film.

19. Optical device according to claim 1, wherein the film is formed from organic materials chosen from polydimethylsiloxane (PDMS), polymethyl methacrylate (PMMA), polyethylene terephthalate (PET), polycarbonate (PC), parylene, epoxy resins, inorganic materials chosen from silicon dioxide, silicon nitride, germanium, metallic materials chosen from titanium, titanium nitride, aluminium, indium tin oxide (ITO).

20. Optical device according to claim 1, wherein the movable part is formed from organic materials chosen from polydimethylsiloxane (PDMS), polymethyl methacrylate (PMMA), polyethylene terephthalate (PET), polycarbonate (PC), parylene, epoxy resins, inorganic materials chosen from silicon dioxide, silicon nitride, germanium, metallic materials chosen from titanium, titanium nitride, aluminium, indium tin oxide, gold, chromium.

21. Optical device according to claim 1, wherein the fixed electrode cooperates with one or more movable electrodes.

22. Optical device according to claim 1, wherein, in working position, the movable electrode is spaced from the fixed electrode by at least one electrically insulating material.

23. Optical device according to claim 1, wherein the leg is sufficiently rigid so that in working position the movable electrode is without mechanical contact with the support.

24. Optical device according to claim 1, wherein the movable part of the electrostatic actuating means is in contact with the liquid or without contact with the liquid.

25. Optical device according to claim 1, wherein the movable part of the electrostatic actuating means come, in working position, into mechanical contact against at least one dielectric stop.

26. Optical device according to claim 1, further comprising control means of the electrostatic actuating means as a function of the spacing existing between the movable electrode and the fixed electrode.

27. Optical device according to claim 1, further comprising at least one fixed sacrificed leg, the free end of which is fastened to the support, this fixed sacrificed leg being intended to be connected to an energy source (U) and to supply via the foot to which it is connected at least one movable electrode of a movable part.

28. Optical device according to claim 1, wherein the film of the membrane is anchored to the support by mechanical anchoring means.

29. Optical device according to claim 1, characterised in that it is a liquid lens with variable focal distance, a liquid lens with optical aberration correction in adaptive optics, a mirror with deformable membrane.

30. Method of producing an optical device with deformable membrane in which:
on an initial substrate, a first sacrificial mould is formed,
a deformable film of the membrane is deposited on the first sacrificial mould so that a peripheral anchoring zone of the film is anchored on the support,
at least one conductive path is formed which runs on the film intended to supply with energy at least one conductive movable part formed later of electrostatic actuating means,
a second sacrificial mould is formed for the movable part of the electrostatic actuating means, this second sacrificial mould extending on the film and on the initial substrate, the movable part that has to have a foot fastened to the film of the membrane in an intermediate zone situated between the anchoring zone and a central zone,
the movable part is deposited on the second sacrificial mould,
the second sacrificial mould is eliminated so as to free one leg of the movable part having a free end and one end connected to the foot,
the movable part and the film are protected with a protection device transferred onto the initial substrate,
a fixed electrode facing the movable part is formed,
the first sacrificial mould is eliminated by means of an access through the initial substrate or the membrane,
a liquid is trapped between the film and the protection device or in the place of the first sacrificial mould.

31. Method according to claim 30, wherein the conductive path is electrically connected by means of a metallised hole traversing the initial substrate to a contact pad situated opposite the film in relation to the initial substrate.

32. Method according to claim 30, wherein, when the movable part is located in the liquid, the fixed electrode is formed on the protection device which is a transparent substrate provided with walls delimiting a cup for the liquid and fixed to the initial substrate by the walls.

33. Method according to claim 30, wherein when the movable part is located in the liquid, the hole in the initial substrate serving to eliminate the first sacrificial mould has at least the size of the central zone.

34. Method according to claim 30, wherein when the movable part is located opposite the liquid in relation to the film, the fixed electrode is formed on a dielectric layer that bears the initial substrate before depositing the film so that the film covers the fixed electrode.

35. Method according to claim 30, wherein, when the movable part is located opposite the liquid in relation to the film, the protection device is a transparent cap.

* * * * *

UNITED STATES PATENT AND TRADEMARK OFFICE
CERTIFICATE OF CORRECTION

| | |
|---|---|
| PATENT NO. | : 8,363,330 B2 |
| APPLICATION NO. | : 12/937977 |
| DATED | : January 29, 2013 |
| INVENTOR(S) | : Sebastien Bolis et al. |

It is certified that error appears in the above-identified patent and that said Letters Patent is hereby corrected as shown below:

On the Title page, in section (73), line 1, replace "Commissariat a l'Energie Atomique" with --Commissariat a L'Energie Atomique et aux Energies Alternatives--.

Signed and Sealed this
Second Day of April, 2013

Teresa Stanek Rea
*Acting Director of the United States Patent and Trademark Office*